(12) United States Patent
Juchymenko

(10) Patent No.: US 11,401,837 B2
(45) Date of Patent: Aug. 2, 2022

(54) SYSTEM, APPARATUS AND METHOD FOR MANAGING HEAT TRANSFER IN POWER GENERATION SYSTEMS

(71) Applicant: Victor Juchymenko, Calgary (CA)

(72) Inventor: Victor Juchymenko, Calgary (CA)

(*) Notice: Subject to any disclaimer, the term of this patent is extended or adjusted under 35 U.S.C. 154(b) by 109 days.

(21) Appl. No.: 16/761,492

(22) PCT Filed: Nov. 5, 2018

(86) PCT No.: PCT/IB2018/001404
§ 371 (c)(1),
(2) Date: May 4, 2020

(87) PCT Pub. No.: WO2019/086960
PCT Pub. Date: May 9, 2019

(65) Prior Publication Data
US 2020/0308992 A1 Oct. 1, 2020

Related U.S. Application Data

(60) Provisional application No. 62/581,578, filed on Nov. 3, 2017.

(51) Int. Cl.
*F01K 23/10* (2006.01)
*F01K 13/00* (2006.01)
(Continued)

(52) U.S. Cl.
CPC ............ *F01K 23/101* (2013.01); *F01K 13/00* (2013.01); *F01K 23/065* (2013.01); *F01K 25/00* (2013.01);
(Continued)

(58) Field of Classification Search
CPC ...... F01K 23/101; F01K 13/00; F01K 23/065; F01K 25/00; F01K 25/10; F01K 27/02; F01N 5/025; H01L 35/30
See application file for complete search history.

(56) References Cited

U.S. PATENT DOCUMENTS 4,622,472 A * 11/1986 Bronicki ................. F01K 27/00
290/40 F
8,418,799 B2 * 4/2013 Richter ................... F01N 5/025
60/320

(Continued)

FOREIGN PATENT DOCUMENTS

CN    103742293 A  *  4/2014
CN    103742293 A     4/2014

OTHER PUBLICATIONS

CN-103742293-A English Translation (Year: 2014).*
PCT/IB2018/001404. International Search Report & Written Opinion (dated Apr. 8, 2019).

*Primary Examiner* — Shafiq Mian
(74) *Attorney, Agent, or Firm* — Loza & Loza, LLP; Peter Zura

(57) ABSTRACT

A heat recovery system that includes at least one an engine, a radiator, an Organic Rankine Cycle (ORC) and a thermoelectric generator (TEG). The radiator may be coupled to the reciprocating engine, and the ORC may be coupled to the reciprocating engine and to the TEG. A control module in the system is configured to divert reciprocating engine jacket water fluid through any of the radiator, ORC and TEG to increase the energy efficiency of the reciprocating engine through heat recovery caused by the diverted fluid.

19 Claims, 13 Drawing Sheets

(51) Int. Cl.
  *F01K 23/06* (2006.01)
  *F01K 25/00* (2006.01)
  *F01K 25/10* (2006.01)
  *F01K 27/02* (2006.01)
  *F01N 5/02* (2006.01)
  *H01L 35/30* (2006.01)

(52) U.S. Cl.
  CPC .............. *F01K 25/10* (2013.01); *F01K 27/02* (2013.01); *F01N 5/025* (2013.01); *H01L 35/30* (2013.01)

(56) References Cited

U.S. PATENT DOCUMENTS

| | | | |
|---|---|---|---|
| 9,683,463 B2 * | 6/2017 | Juchymenko | F01K 23/02 |
| 2009/0320477 A1 * | 12/2009 | Juchymenko | F01K 23/065 60/651 |
| 2013/0086902 A1 * | 4/2013 | Khadiya | F01K 23/065 60/645 |
| 2018/0038473 A1 * | 2/2018 | Dickson | F16H 57/0417 |

* cited by examiner

SYSTEM, APPARATUS AND METHOD FOR MANAGING HEAT TRANSFER IN POWER GENERATION SYSTEMS

CROSS-REFERENCE TO RELATED APPLICATIONS

This application is the U.S. National Stage of International Patent Application No. PCT/IB2018/001404 filed on Nov. 5, 2018, which claims the benefit of priority from U.S. Provisional Patent Application No. 62/581,578 filed on Nov. 3, 2017, the disclosures of the foregoing applications being incorporated herein by reference in their entirety for all applicable purposes.

FIELD OF THE DISCLOSURE

The present disclosure relates to managing heat transfer in power generation systems. More specifically, the present disclosure relates to distributing waste heat from a reciprocating engines exhaust and cooling fluid between a Thermoelectric Generator (TEG) and an Organic Rankin Cycle (ORC) system.

BACKGROUND

With new developments in materials for use in Thermo-Electric Generators (TEG), the integration of TEG's into commercial applications is becoming economic and therefore the number of applications is increasing.

To optimize a TEG's efficiency, generally high temperature differentials may be required to make their operation economic. Typically, because of the high temperature differential requirement, TEGs are typically used in engine exhaust heat recovery and that heat is then converted to electric power.

Without liquid cooling, the power generated from TEGs may be limited to the amount of air cooling that can be obtained. Air exchanging fins (or fin tubes) are limited in the amount of cooling they provide and can be further be limited to physical space constraints within the proximity of the TEG. The amount of energy outputted from the TEG can be increased by liquid cooling the downside temperature of the TEG to increase temperature differential and keep the size of the TEG equipment a reasonable size. In the case of a reciprocating engine, they may be configured with at least one radiator to cool the engine (e.g., by collecting the engines radiant heat energy from combustion of the fuel) and then dissipating that heat energy through an air cooled radiator. By using the engines cooling fluid (or a separate thermal fluid cooling medium), both the reciprocating engine and the TEG can both benefit from improved operation and/or efficiency.

BRIEF DESCRIPTION OF THE FIGURES

The present disclosure will become more fully understood from the detailed description given herein below and the accompanying drawings which are given by way of illustration only, and which thus do not limit the present disclosure, and wherein.

DETAILED DESCRIPTION

Figure 1:
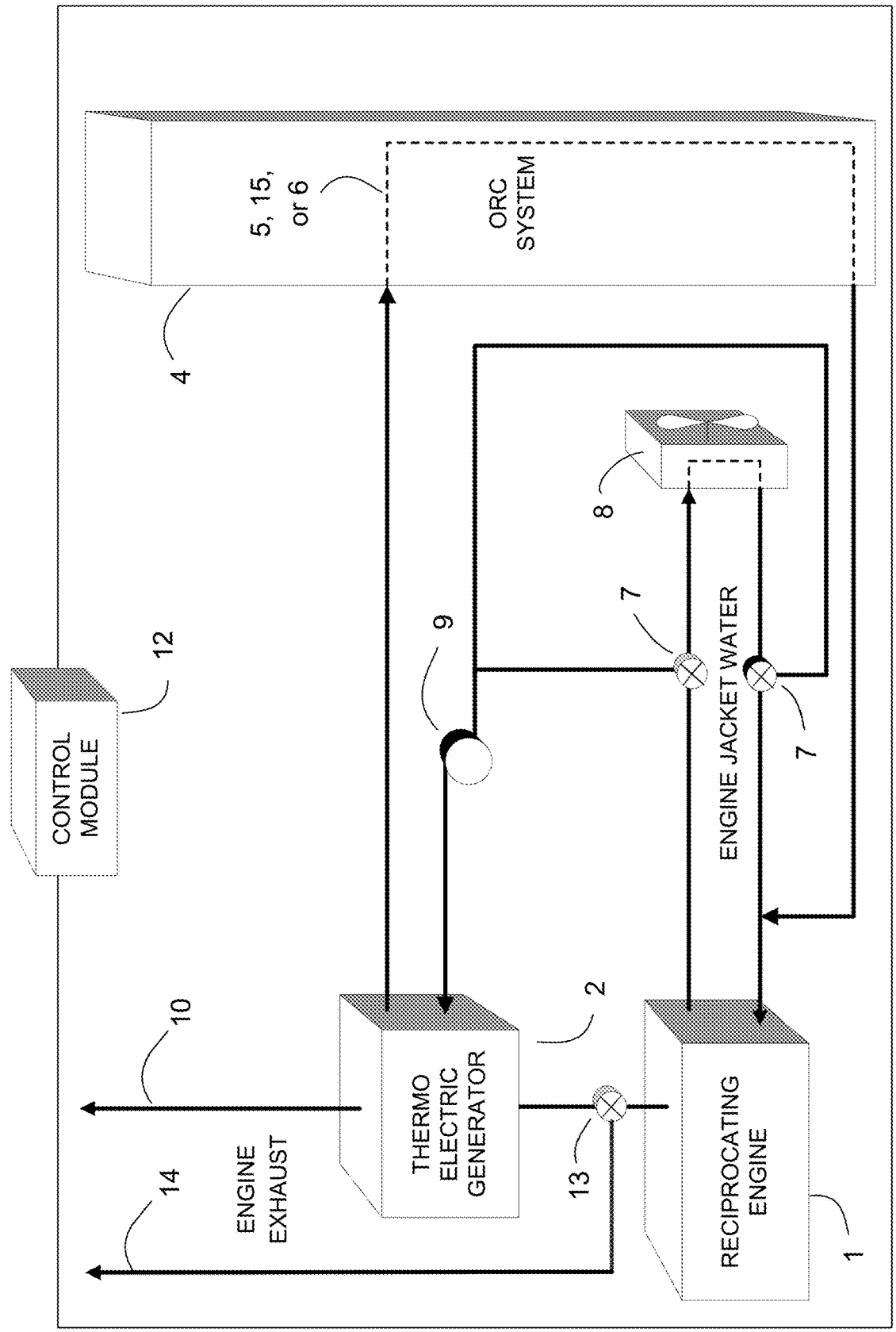
FIG. 1 shows a power generation system comprising a reciprocating engine, radiator and TEG coupled to an ORC system with circulating pumps control valves, wherein certain system controls may be provided by a control module under an illustrative embodiment.

The figures and descriptions provided herein may have been simplified to illustrate aspects that are relevant for a clear understanding of the herein described devices, systems, and methods, while eliminating, for the purpose of clarity, other aspects that may be found in typical similar devices, systems, and methods. Those of ordinary skill may thus recognize that other elements (such as pressure or temperature sensing and transmitting devices) and/or operations may be desirable and/or necessary to implement the devices, systems, and methods described herein. But because such elements and operations are known in the art, and because they do not facilitate a better understanding of the present disclosure, a discussion of such elements and operations may not be provided herein. However, the present disclosure is deemed to inherently include all such elements, variations, and modifications to the described aspects that would be known to those of ordinary skill in the art.

Exemplary embodiments are provided throughout so that this disclosure is sufficiently thorough and fully conveys the scope of the disclosed embodiments to those who are skilled in the art. Numerous specific details are set forth, such as examples of specific components, devices, and methods, to provide this thorough understanding of embodiments of the present disclosure. Nevertheless, it will be apparent to those skilled in the art that specific disclosed details need not be employed, and that exemplary embodiments may be embodied in different forms. As such, the exemplary embodiments should not be construed to limit the scope of the disclosure. In some exemplary embodiments, well-known processes, well-known device structures, and well-known technologies may not be described in detail.

The terminology used herein is for the purpose of describing particular exemplary embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The steps, processes, and operations described herein are not to be construed as necessarily requiring their respective performance in the particular order discussed or illustrated, unless specifically identified as a preferred order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another element, component, region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the exemplary embodiments.

As explained briefly above, the amount of energy recovered from a TEG can be increased by configuring liquid cooling. In one example the downside temperature of a TEG may be liquid-cooled to increase temperature differential and keep the size of the TEG equipment a reasonable size. As introduced above, incorporating an ORC system with a TEG, for example, to recover waste heat from a reciprocating engine, can provide additional advantages. Specifically, by transferring different grades and types of heat from the reciprocating engine to the TEG and/or the ORC system, in the various equipment combinations and embodiments discussed in greater detail below, the overall efficiency of the reciprocating engine, the TEG and the ORC system can be improved because an ORC system may only require heat in the 175° F. (and higher) range to make economic power. Specifically, the heat rejected by the reciprocating engine's exhaust can be used to generate power in a TEG. The engine exhaust rejected to the TEG first and then recovered for use in an ORC system to generate more power. The engines discharge jacket water contains energy that can be used in an ORC system. Combining these heat streams and moving them between one another can produce a more efficient use of energy. Such a configuration may advantageously recover useable thermal energy and place it in optimal locations such that it improves the overall efficiency of the system. Heat rejected by the reciprocating engine can be used to power a TEG and/or an ORC or in application of low-grade heat such as district heating, building heating, heat tracing of pipes, etc. Additionally, heat rejected by the TEG can be used in an ORC system, and rejected heat from the TEG and ORC can be used, in certain illustrative embodiments, for low-grade uses such as district heating, building heating, process applications, bulk material drying, heat tracing of pipes, etc.

Under an illustrative embodiment, a heat transfer process may begin with fuel combustion in a diesel engine, which may be powered by bio-diesel, natural gas, propane, gasoline, and/or diesel fueled engines, and the like. During operation, an engine may emit exhaust and radiant heat into the engines jacket water that may have that energy dissipated through the use of an air cooled (or other suitable) radiator. Other engine rejected heat may be dissipated via the lubricant and/or auxiliary cooling system (e.g., turbo cooling) and can be used in a similar manner described herein, provided its temperature fits into the ORC system or for other purposes. An ORC system can use rejected waste heat from any source to pre-heat, evaporate or superheat the working fluid (also known as propellant) and therefore insertion of that waste heat into locations in the ORC process where the working fluid (propellant) is at a lower temperature than the waste heat, is desired.

Heat rejected in an engine's exhaust (e.g., 14) may pass through a TEG (e.g., 2) that may generate power. The TEG may then discharge engine exhaust at a lower temperature. However, the exhaust may still contain usable energy for heat in an ORC system. At least some of the remaining cooled exhaust may then be vented to atmosphere (e.g., via a control valve). In some illustrative embodiments, heat rejected by a reciprocating engine that is collected by the engine jacket water may be intercepted before it is dissipated in the radiator, and that energy can then be used in the ORC system. In addition to the energy in the jacket water, additional energy can be added to that heated jacket water in some illustrative embodiments by adding rejected heat from the TEG. In some illustrative embodiments, the cooling duty provided to the TEG may be configured as the additional heat to the jacket water which may be used in an ORC system.

Various piping configurations and combinations described in greater detail below may produce optimal use of the rejected heat energy from the equipment and configurations described herein in FIGS. 1-13. In other words, many combinations of recovering waste heat from at least one of the engine, the TEG and the ORC system, and recycled to these components at appropriate insertion points into their respective processes may improve the efficiency of these (e.g., engine, TEG, and ORC) systems. As an example, on an ORC system, the addition of heat energy to the ORC system should be configured at a higher temperature than the ORC systems propellant such that heat flows from the waste heat source and into the ORC systems propellant that will then be used to generate power in the ORC system, thereby increasing the efficiency of the ORC.

As another example of building up heat transfer, the engine exhaust discharged from the TEG can also be used in the ORC. This energy can be collected in the engine's jacket water by cooling the reciprocating engine combined with the energy collected from cooling the TEG, in addition to heating the jacket water with the exhaust gases discharged from the TEG. Additionally, the engine exhaust discharged from the TEG can be transferred to the ORC either through a thermal fluid or directly venting the exhaust into the ORC system or to atmosphere via a gaseous control/diverting valve (not shown). These types of opportunities exist to increase the efficiency of the either each individually or collectively the reciprocating engines output, the TEG's output and/or the ORC's output.

The figures provided herein show various configurations and embodiments comprising various piping combinations and arrangements that can be used to increase the overall energy efficiency of the reciprocating engine and adjoining system. A heat balance and energy balance may be conducted on the engine to which the heat recovery equipment is coupled to so that the appropriate configuration is applied. These calculations can be conducted by the heat recovery systems control module 12 such that it dynamically adjusts the flow through the system with the objective of improving the efficiency at which the system is operating. This may be based on the available waste heat energy sources, including, but not limited to, reciprocating engine exhaust, reciprocating engine jacket water, TEG cooling apparatus, exhaust discharge from the TEG, and/or thermal fluid discharge the TEG, and/or thermal fluid discharge from the ORC's heat exchangers (e.g., High-ORC (5), Mid-ORC (15) and/or Low-ORC (6)). Generally speaking, the terms Low-ORC, High-ORC, and Mid-ORC generally are not intended to reflect the relative operating temperatures to one another, but are only named differently to distinguish between them and highlight the fact that there can be multiple heat streams entering the ORC (e.g., alternately "first-ORC", "second-ORC", "third-ORC"). Specifically, those heat streams may be arranged such that the lowest temperature heat stream goes into the ORC at a point to interface with propellant that is at a lower temperature than the waste heat source entering the ORC system, and that the order in which the waste heat streams interface with the ORC may be rearranged such that waste heat is always adding energy to the ORC. As an example the waste heat streams can be contributing to the ORC by pre-heating, evaporating or superheating the propellant in the ORC system 4.

It should be noted that different reciprocating engine makes and models may have different efficiencies from one another, as well as different proportional heat reject to the exhaust and heat reject to the jacket water. Furthermore, two reciprocating engines of the same make and model could be configured differently with turbo chargers, varying turbo boost levels on those turbo's, varying thermostat opening temperature settings, etc. that affect the reject heat from an engine. Further yet, each reciprocating engine may have different operating conditions and loads (e.g., exhaust temperature, jacket water flow and temperature, etc.) thereby affecting the amount of heat being generated which will then affect the heat recovery equipment's operation. Accordingly, various configurations under the present disclosure may be tailored to suit a particular application having a desired (or optimal) performance/efficiency. In certain illustrative embodiments, control module 12 may be configured to calculate the energy efficiency of any or all of the engine, TEG or ORC equipment during operation and adjust or alter the flow rates throughout the system such that energy efficiency is improved with each change.

Control module 12 may be configured as a processing device and include a processor or processor circuit, one or more peripheral devices, memory/data storage, and communication circuitry, among other components. The processor for the control module 12 may be embodied as any type of processor currently known or developed in the future and capable of performing artificial intelligence or other functions described herein. For example, the processor may be embodied as a single or multi-core processor(s), digital signal processor, microcontroller, or other processor or processing/controlling circuit. Similarly, the memory/data storage of control module 12 may be embodied as any type of volatile or non-volatile memory or data storage currently known or developed in the future and capable of performing the functions described herein. In operation, memory/data storage may store various data and software used during operation of the control module 12 such as access permissions, access parameter data, operating systems, applications, programs, libraries, and drivers. The memory/data storage of control module 12 may be communicatively coupled to the processor via an I/O subsystem, which may be embodied as circuitry and/or components to facilitate input/output operations with the processor, memory/data storage, and other components of the control module 12, whether the control module 12 is programmed in such a manner or is a self-learning computing module. For example, the I/O subsystem may be embodied as, or otherwise include, memory controller hubs, input/output control hubs, firmware devices, communication links (i.e., point-to-point links, bus links, wires, cables, light guides, printed circuit board traces, etc.) and/or other components and subsystems to facilitate the input/output operations. In some embodiments, the I/O subsystem may form a portion of a system-on-a-chip (SoC) and be incorporated, along with the processor, memory/data storage, and other components of the control module 12, on a single integrated circuit chip.

The communication circuitry (communication interface) for control module 12 may include any number of devices and circuitry for enabling communications between control module 12 and one or more other external electronic devices and/or systems. Control module 12 may also include peripheral devices and may include any number of additional input/output devices, interface devices, and/or other peripheral devices. The peripheral devices may also include a display, along with associated graphics circuitry and, in some embodiments, may further include a keyboard, a mouse, audio processing circuitry (including, e.g., amplification circuitry and one or more speakers), and/or other input/output devices, interface devices, and/or peripheral devices.

The control module 12 may also be configured to communicate with a network such as a wired and/or wireless network and may be or include, for example, a local area network (LAN), personal area network (PAN), storage area network (SAN), backbone network, global area network (GAN), wide area network (WAN), or collection of any such computer networks such as an intranet, extranet or the Internet (i.e., a global system of interconnected network upon which various applications or service run including, for example, the World Wide Web). The communication with control module 12 may be configured to use any one or more, or combination, of communication protocols to communicate such as, for example, a wired network communication protocol (e.g., TCP/IP), a wireless network communication protocol (e.g., Wi-Fi, WiMAX), a cellular communication protocol (e.g., Wideband Code Division Multiple Access (W-CDMA)), and/or other communication protocols. The above concepts are not limited to programmed equipment, they are also applicable to self-learning computing equipment that will optimize the overall energy efficiency of the components or the system. While not explicitly shown in the figures, those skilled in the art will appreciate that control module 12 may be configured to communicate with other control modules of a heat recovery system, as well as sensors configured to sense environmental/system conditions during operation.

Turning to the figures, the location and/or depiction of valves (labeled as 7 for fluid valves and 13 for engine exhaust valve) are generally intended to represent a flow diverting mechanism in which one valve or a series of valves operating together (e.g., via a control module or linkage system) may divert a required flow to meet the objective of increased efficiency of the reciprocating engine 1, TEG and/or ORC system. The inclusion of circulating pumps 9 is implied and their illustrated location(s) are not intended to be limiting. One skilled in the art would readily understand that alternate and/or additional locations may be configured, depending on the application, which may require movement of fluids and/or gases, thereby requiring equipment to divert gases or flow fluids, as required. In some embodiments, the jacket water circulating pumps inherent to the reciprocating engines may not be engineered for the additional back pressure created by adding equipment to the reciprocating engines jacket water flow system. In such a configuration, changes to the existing pump or the addition of booster pumps may be required in the fluid process loops. For thermal fluid loops (as shown in FIGS. 3, 6, 7, and 9) the addition of a circulating pump may also be required. Conversely, in FIG. 13, a circulating pump on the exhaust pipe 10 may not be required, provided the engines allowable exhaust back-pressure is considered in the design of the heat exchanger.

For certain illustrative embodiments discussed herein, it is to be understood that the reciprocating engine 1 should be able to operate on its own, preferably without the burden of other equipment connected to it, as if the heat recovery equipment was not connected. A default configuration may be configured such that the engine exhaust is diverted by a valve (e.g., 13) to atmosphere through an exhaust pipe (e.g., 14), and the jacket water is piped to the engine's radiator (e.g., 8) for cooling. If the piping configurations herein do not directly state this, it may be implied.

In the following, the below listed reference numbers for FIGS. 1-13 represent illustrative apparatuses and orders or sequences (depicted as arrows in the text of the present specification) in which the thermal fluids may flow (or in the case of exhaust gases, the order in which they flow) as depicted in each Figure:

| Reference No. | Apparatus |
| --- | --- |
| 1 | Reciprocating Engine |
| 2 | Thermo-Electric Generator (TEG) |
| 3 | Heat Exchanger ("Thermal Fluid Heater") |
| 5 | Heat Exchanger ("High-ORC") |
| 6 | Heat Exchanger ("Low-ORC") |
| 7 | Control Valves |
| 8 | reciprocating engines radiator |
| 9 | Circulating Pump |
| 10 | Engine Heat Recovery Exhaust Pipe |
| 11 | Bi-directional Pipe Spool |
| 12 | Control Module |
| 13 | Engine Exhaust Control Valve |
| 14 | engines Bypass Exhaust Pipe |
| 15 | Heat Exchanger ("Mid-ORC") |
| 85 | Exhaust to propellant Heat Exchanger |

Turning to FIG. 1, a first configuration 1→2→5→1 is illustrated, where the reciprocating engine jacket water is circulated from reciprocating engine 1 (bypassing the engines radiator 8) to the TEG 2 to add thermal energy to the jacket water. This higher energy jacket water is then circulated to the ORC system 4 (through either heat exchanger High-ORC 5, Mid-ORC 15 or Low-ORC 6) where thermal energy may be transferred from the jacket water to the ORC systems 4 propellant, before being returned to the reciprocating engine 1 to pick up radiant heat energy. The engine's radiator 8 may be operated in parallel or in series, depending on the application, however in this example in parallel to the waste heat system in this configuration. Using the radiators capacity (in series) to cool the jacket water before it reaches the TEG 2 may increase the overall system efficiency. It is important to note that anywhere a control valve 7 is involved, these valves do not necessarily have to function as "open" or "closed". They can be operated in partially "open" or partially "closed" thus allowing for split flow to both paths departing the control valve. It should be understood that alternate and/or additional embodiments are contemplated in the present disclosure, particularly with respect to the embodiments described below. In some illustrative embodiments, split flow may be provided at any of the control valves where flow can be split fully or partially to any downstream path from the control valve, thereby affecting heat transfer to downstream devices/equipment.

The configuration of FIG. 1 may advantageously create a relatively constant temperature differential across the TEG (thus avoiding thermal cycling of the TEG or ORC components) because, at a specified load, the engine emits a relatively constant exhaust temperature and the engines internal thermostat only discharges jacket water when it reaches the temperature setting of the thermostat, eventually reaching a steady state of reject heat to the power output of the engine. In some illustrative embodiments, the engine's exhaust may be discharged through exhaust pipes 10 and 14 and may be generally constant when being discharged from the reciprocating engine and therefore the temperature differential across the TEG 2 should be relatively constant.

Control module 12 may be configured to monitor the temperature of the jacket water returning to the reciprocating engine 1 and then modulate or adjust control valves 7 to vary the flow through the respective piping arrangements (e.g., to the heat recovery equipment or the radiator 8) so that appropriate temperature ranges are maintained. A further detail in return temperature control can be the use of splitting the flow into multiple streams concurrently and allowing the streams to merge at another point in the process. This concept should be applied to virtually all configurations where the engines radiator 8 can be operated in parallel to one or more other components such that the flow is split to the radiator 8 and that other component (TEG 2, Thermal Heating Fluid (THF) 3, heat exchangers High-ORC 5, Mid-ORC 15, or Low-ORC 6) or to a multiplicity of components in series with one another before merging the flow streams with the flow from the radiator 8 and the flow streams going through the other component(s). This method of control and process flow will increase the efficiency of the individual equipment if operated independently and thus will increase efficiency of the configurations depicted below and thus the concept should be understood to be applied in any of the Figures or Configurations stated below. A good example of this concept has been illustrated in FIG. 1 (Configurations 8, 9, and 10) and FIG. 8 description (including Configurations 9 thru 12) outlined below. It should be noted that the split flow can occur at the beginning, the middle or towards the end of the flow loop originating at the reciprocating engine. Meaning, wherever the flow can be split off to divert a portion of the flow to the radiator, and then have that flow merge with the stream that flowed to the other stream (such that they always merge before re-entry to the reciprocating engine), then all combinations can work, and would be suitable methods for return jacket water temperature control. At substantially the same time, the control module 12 may also make appropriate adjustments to the amount of air flow across the radiator by varying the fan speed or blade pitch operating in front of the engines radiator 8 and make adjustments to the equipment within the ORC system 4. This objective can also be accomplished by diverting exhaust gases around the TEG 2 and the Thermal Fluid Heater (TFH) 3 by controlling valve 13 to divert some or all of the engine exhaust into piping 14.

In natural gas compression arrangements, the jacket water cooling radiator may be bundled in an aerial cooler with other fin tube radiator-type sections (used to cool the compressed gas), and the aerial cooler is equipped with a large cooling fan to draw ambient air across the radiator sections. In gas compression this aerial cooler fan may typically be powered by the reciprocating engine. In order to operate the system as described above, the fan drive should be decoupled from the reciprocating engine and converted to electric drive (e.g., with a variable frequency drive (VFD)) so that power generated by the TEG or the ORC can be used to power the aerial cooler fan. Also, in natural gas compression cooling, the determining factor to run the cooling fan may at times be dictated by the amount of cooling the jacket water requires or at times by the amount of cooling the compressed gas requires.

The following are component configurations depicting the order in which thermal fluid may flow for the configuration of FIG. 1 and in other illustrative embodiments disclosed herein. Where a '+' sign is used, it is to show a separate thermal loop in which a separate thermal fluid or exhaust gas is used to move thermal energy around the system shown in the figure. Where a '/' sign is used, it is to indicate a split in the flow in the configurations and the flow is then assumed to take the path of least resistance until the flows merge again at an appropriate convergence point. For example, in "Configuration 8" of FIG. 1 shown below, the designation 1→8/2→5→1 illustrates that the flow from reciprocating engine 1 to radiator 8 (i.e., 1→8) is split to the TEG 2 and the radiator 8 by the control valve 7 that is located between the reciprocating engine 1 and the radiator 8 (which can also be described to be positioned between the reciprocating engine 1 and the TEG 2). One partial stream of the total flow, flows through radiator 8 and the remaining portion of the total flow flows through the TEG 2 which then goes on to flow through the ORC system (High-ORC 5) which returns (shown as dotted line) flow back to reciprocating engine 1 (i.e., 2→5→1) where it is merged with the other part of the flow that circulated through radiator 8 (i.e., 1→8), prior to entering the reciprocating engine.

Furthermore, it should be appreciated by those skilled in the art that the specific sequences are illustrative only, and are not intended to be limiting. Alternate or additional sequences are contemplated in the present disclosure. In certain illustrative embodiments, sequences starting with a particular component (e.g., reciprocating engine 1) that "circle back" to the component (e.g., 1→8→2→5→1) may be considered a closed-loop configuration, where a component from which a sequence starts also may serve as the ending point of the sequence. Specifically, because the source of the thermal energy is usually originated by the reciprocating engine 1, the sequencing/numbering applied starts and finishes at the reciprocating engine 1, but can be shown starting at any other point in the sequence and finishing back at that sequence.

Various illustrative configurations for FIG. 1:
Configuration 1:
1→2→5→1
Configuration 2:
1→2→6→1
Configuration 3:
1→2→15→1
Configuration 4:
1→8→1+14
Configuration 5:
1→8→2→5→1
Configuration 6:
1→8→2→15→1
Configuration 7:
1→8→2→6→1
Configuration 8:
1→8/2→5→1 (split flow between 2 and 8)
Configuration 9:
1→8/2→6→1 (split flow between 2 and 8)
Configuration 10:
1→8/2→15→1 (split flow between 2 and 8)

Figure 2:
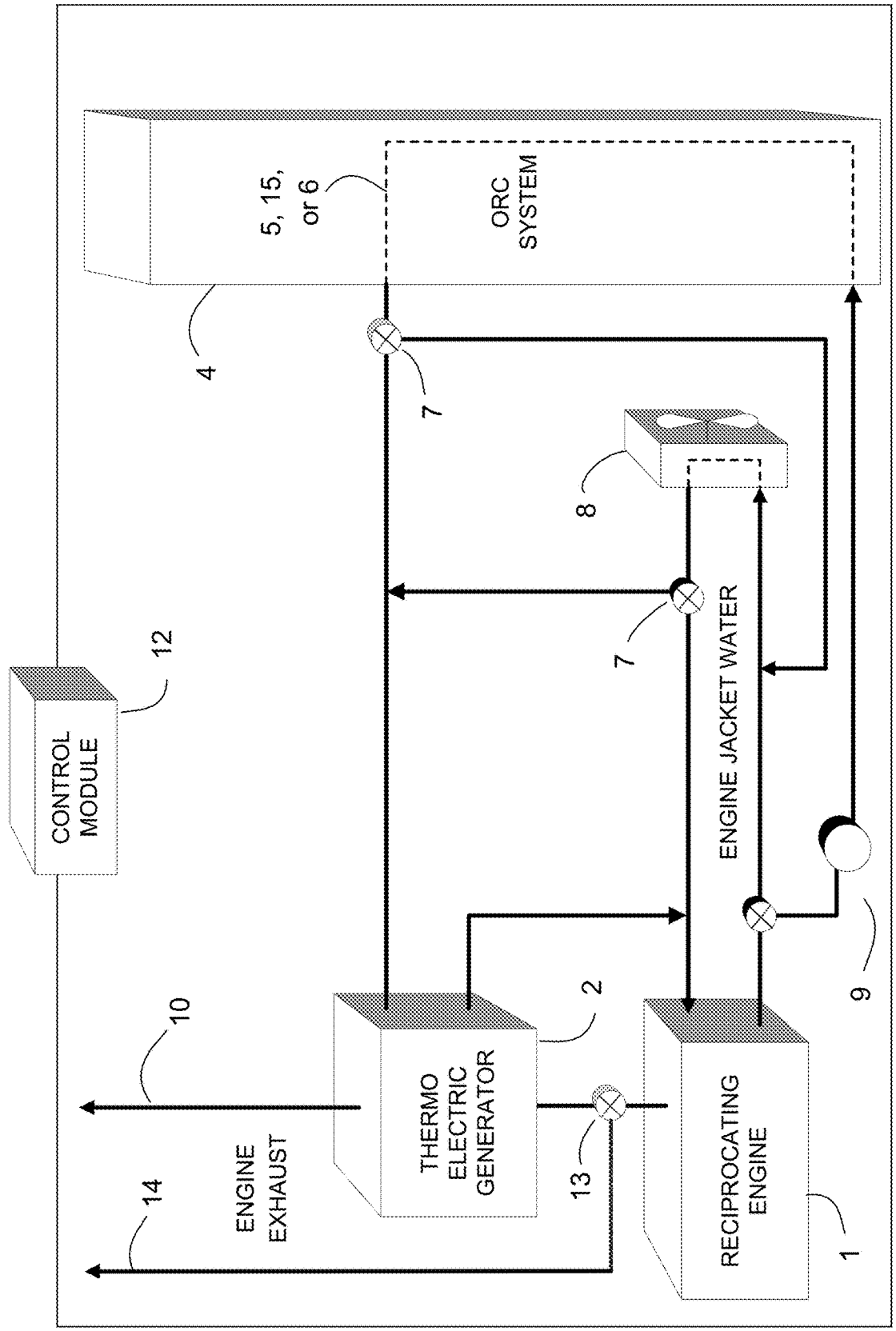
FIG. 2 shows another power generation system comprising a reciprocating engine, radiator and TEG coupled to an ORC system with circulating pumps control valves, wherein certain system controls may be provided by a control module under an illustrative embodiment.

Turning now to FIG. 2, this configuration is substantially similar to the configuration illustrated in FIG. 1, with the exception that the jacket water circulates in the opposite direction. Referring briefly to Configuration 4 below (1→5→8→2→1), the jacket water is first circulated from the reciprocating engine 1 to the ORC system 4 (heat exchanger 5, 6, or 15) so that the ORC system 4 can extract thermal energy from the engine jacket water. The fluid, now cooled by the ORC system 4, discharges the cooled engine jacket water to the radiator 8 for additional cooling before being sent to TEG 2, which then picks up heat and returns to the reciprocating engine 1. The potential benefit of this configuration, relative to that shown in FIG. 1, is that the ORC system 4 and the radiator 8 can both extract thermal energy from the jacket water before it is used to cool the TEG 2 thereby increasing the temperature delta across the exhaust side of the TEG and the jacket water cooling side of the TEG 2.

Further, depending on how much the temperature of the jacket water is reduced in the heat exchanger 5, 15 or 6, the jacket water may be returning to the engine at too cold of a temperature. Accordingly, this configuration may have the ORC extract more thermal energy from the jacket water than if used in a traditional ORC system because in those systems care must be taken not to extract too much energy from the jacket water so that the engine thermostat does not modulate, thereby reducing the flow of jacket water. Also, care must be taken so as not to return the jacket water to the engine at too high of a temperature for risk of the reciprocating engines control system shutting down the engine in an overheat situation. Thereby, the ORC system should be extracting more energy from the jacket water stream or the flow between the radiator 8 and the balance of the heat recovery equipment should be proportioned by the control module 12.

As background, if the engines return jacket water is over cooled, the engine thermostatic valve will reduce the flow rate through the engine by closing the thermostatic valve inherent to the engine. This will retain the jacket water in the engine for a longer period until it reaches the appropriate discharge temperature. In this configuration, the jacket water flow will not be steady (because the engines thermostatic valve will be modulating) thereby disrupting the steady state flow of the jacket water which would then affect the operation of the ORC system by modulating the amount of heat in the ORC system. To prevent the engine thermostat from modulating, the ORC can recover the amount of radiant thermal energy the engine is discarding and add back some thermal energy captured in the jacket water from the TEG before it returns to the reciprocating engine 1, such that the net heat extracted from the jacket water plus the amount added back is the amount of energy that they reciprocating engine requires to not modulate the engines thermostatic valve, which would then modulate the amount of jacket water flow from the engine. By lowering the temperature of the jacket water beyond the normal range in the ORC system 4, this extra amount of energy rejected from the jacket water will be what is recoverable from cooling the TEG 2. The net result is the heat energy (from cooling the TEG) will be added back to the jacket water flow before it is returned to the reciprocating engine 1, and the reciprocating engines thermostatic valve will not modulate and affect the amount of jacket water flow. Simply put: reject thermal energy from reciprocating engine+reject thermal energy from TEG (via cooling)=amount of thermal energy transferred to the ORC system+thermal losses On the other hand, if not enough energy is removed from the jacket water, then the opposite problem will be created and the control module 12 will have to make other system adjustments to pick up less heat from the TEG 2, the TFH 3 or reject heat to the radiator 8 (by operating the radiator in parallel and proportioning jacket water flow to the other components) or divert exhaust heat around the TEG 2 or TFH 3.

As in the previous configuration, control module 12 may monitor the temperature of the jacket water returning to the reciprocating engine 1 and then modulate control valve 7 and/or 13 to vary the flow through the respective piping arrangement so that appropriate jacket water return temperature ranges are maintained. At the same time, control module 12 will also make appropriate adjustments to the fan operating in front of the engines radiator 8 and adjustments to the equipment within the ORC system 4.

Various illustrative configurations for FIG. 2
Configuration 1:
1→5→2→1
Configuration 2:
1→15→2→1
Configuration 3:
1→6→2→1
Configuration 4:
1→5→8→2→1
Configuration 5:
1→15→8→2→1
Configuration 6:
1→6→8→2→1
Configuration 7:
1→8→1+14
Configuration 8:
1→8→2→1+14
Configuration 9:
1→5/8→2→1 (split flow between 5 and 8)
Configuration 10:
1→15/8→2→1 (split flow between 15 and 8)
Configuration 11:
1→6/8→2→1 (split flow between 6 and 8)
Configuration 12:
1→2/8→1+14 (split flow between 2 and 8)

Figure 3:
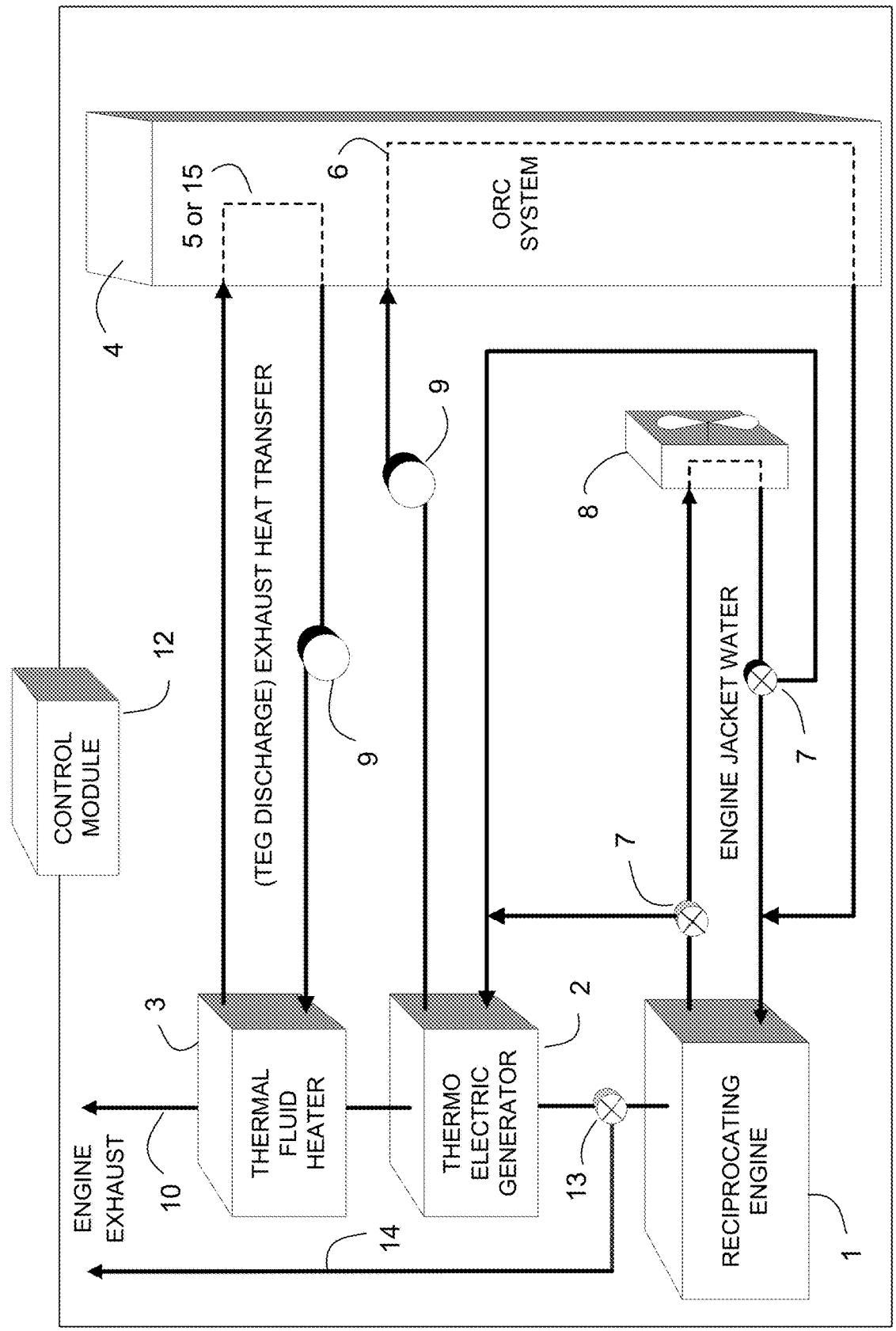
FIG. 3 shows yet another power generation system comprising a reciprocating engine, radiator, TEG, and thermal fluid heater coupled to an ORC system with circulating pumps control valves, wherein certain system controls may be provided by a control module under an illustrative embodiment.

FIG. 3 is shown having a configuration similar to FIG. 1, where the embodiment of FIG. 3 adds the feature of recovering additional thermal energy from the reciprocating engines exhaust flow that is discharged from the TEG 2. The exhaust may pass through a Thermal Fluid Heater (TFH) 3 thereby picking up additional thermal energy that can be used in the ORC system 4 in heat exchanger High-ORC 5 or Mid-ORC 15.

In Configuration 3 (1→8→2→6→1+3→5→3) of FIG. 3, a first recovery loop may comprise the reciprocating engine 1, the engines jacket water, a TEG 2 connected to engine exhaust pipe 10, the heat exchanger Low-ORC 6 in the ORC system 4, and the reciprocating engines radiator 8. The second recovery loop is comprised of a thermal fluid heater TFH 3 in the exhaust stream that operates with a segregated heat recovery loop (using water, water/glycol, or thermal oil) to transfer thermal energy to the ORC system 4 via heat exchanger High-ORC 5. In this configuration, the jacket is cooled in the radiator 8 prior to be moved to the TEG 2. Thermal energy is added in the jacket water by the TEG and then sent to the ORC system 4 to transfer heat to heat exchanger Low-ORC 6 prior to being returned to the reciprocating engine 1.

The recovered energy from the two loops may be arranged in the ORC system 4 such that the lower temperature stream is used where a lower propellant temperature in the ORC system 4 process is located. Therefore, the thermal energy is transferring from the higher temperature thermal fluid into the lower temperature ORC process (whether that is for preheating, evaporating, or for super heating). That is, the heat streams may progressively add energy in the ORC system 4 such that each energy stream is interfacing with temperatures that are hotter than the ORC system 4 propellant, at the interface (heat exchanger). Meaning, thermal energy entry into the ORC system is dictated by progressively increasing the temperature of the ORC's propellant (working fluid).

As in the previous configuration, control module 12 may monitor the temperature of the jacket water returning to the reciprocating engine 1 and then modulate the various heat diverting or heat dissipating control modes, including diverting heat away from the heat recovery equipment such as diverting exhaust gases around the TEG 2 and the TFH 3 by controlling valve 13 to divert the exhaust gas into engine exhaust pipe 14 to divert exhaust flow around the equipment in bypass piping. Generally speaking, the hierarchy in the control system should be first to optimize the operation of the reciprocating engine as that is the primary source of thermal energy for either the ORC or the TEG, because without the engine running there will not be thermal sources for the ORC or the TEG.

Various illustrative configurations for FIG. 3
Configuration 1:
1→8→1+14
Configuration 2:
1→2→6→1+3→5→3
Configuration 3:
1→8→2→6→1+3→5→3
Configuration 4:
1→2/8→6→1+3→5→3 (split flow between 2 and 8)
Configuration 5:
1→2/8→6→1+14 (split flow between 2 and 8)

Figure 4:
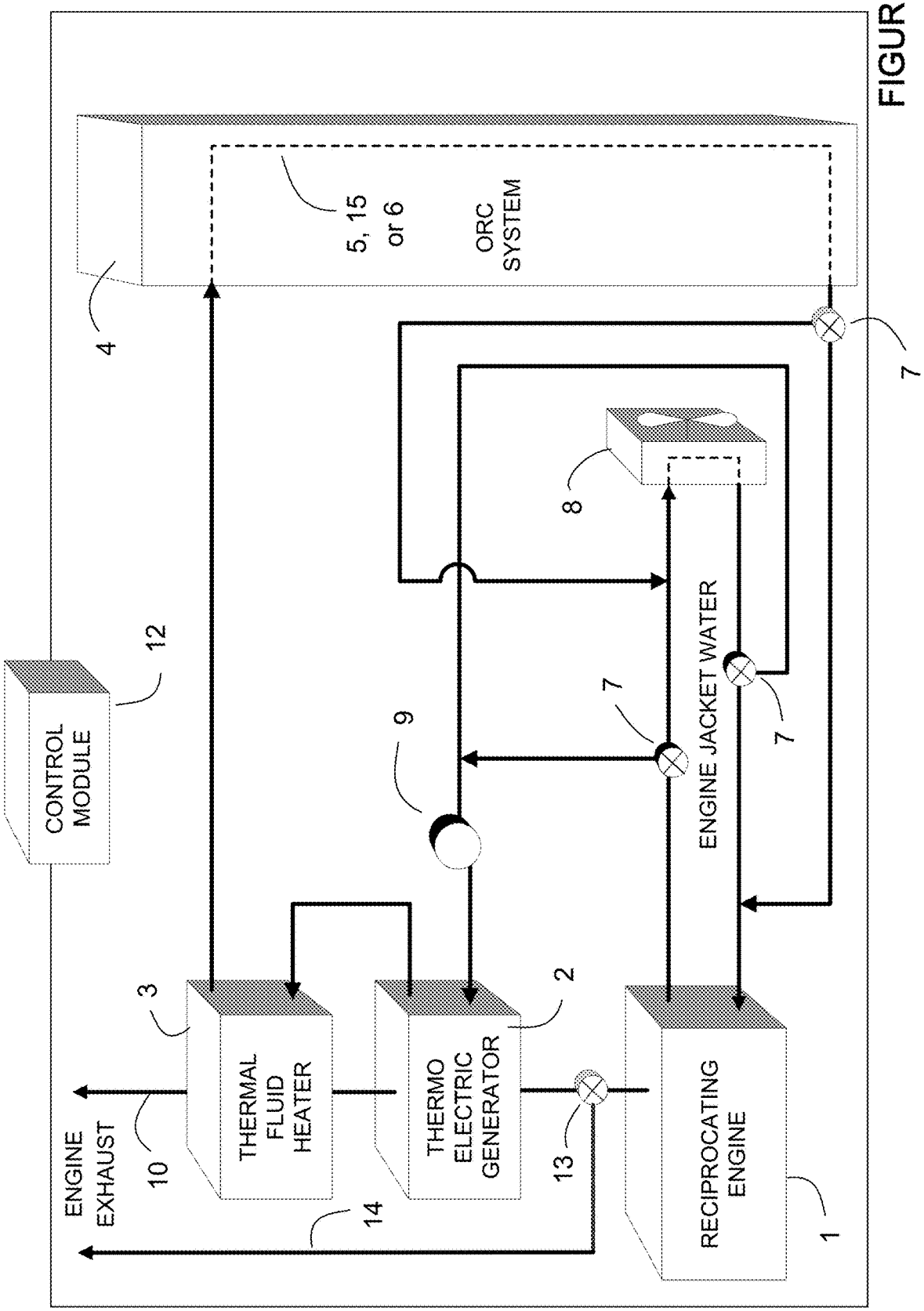
FIG. 4 shows yet another power generation system comprising a reciprocating engine, radiator, TEG, and thermal fluid heater coupled to an ORC system with circulating pumps control valves, wherein certain system controls may be provided by a control module under an illustrative embodiment.

FIG. 4 is similar to the configuration described in FIG. 3, where the reciprocating engines jacket water is circulated from the reciprocating engine 1 to the TEG 2, the below configurations differ by directly sending the jacket water from the TEG 2 to the TFH 3 before sending the jacket water to the ORC system 4 (to either High-ORC 5, Mid-ORC 15, or Low-ORC 6 heat exchangers). The embodiments of FIGS. 1-3 did not combine the heat from the TFH 3 with the heat energy from the reciprocating engine 1 and the TEG 2. With the radiator 8 configured in parallel to the waste heat recovery equipment, once the thermal energy from the jacket water is removed by the ORC system 4, the jacket water is returned to the reciprocating engine 1 to repeat the process. If the radiator 8 is configured in series with the waste heat recovery equipment, then the jacket water has thermal energy removed by the ORC system 4 and is further cooled by the radiator 8 before being returned to the reciprocating engine to repeat the process. Fan control on the radiator can trim heat rejection through the radiator 8 when configured in either series or parallel getting the jacket water temperature to the appropriate temperature before returning to the engine to provide adequate cooling for the engine. The jacket water flow rate in combination with the temperature differential (out temperature minus the return temperature) of the jacket water will dictate the amount of thermal energy rejected from the engine.

As shown in Configuration 10 (1→8→2→3→6→1) the jacket water is cooled in the radiator 8 prior to being piped to the TEG 2. From the TEG, additional thermal energy is transferred to the jacket water by the TFH 3 before being used in the ORC system 4 (using either heat exchanger High-ORC 5, Mid-ORC 15, or Low-ORC 6).

As previously described, the engines radiator 8 can be configured to operate in parallel or in series with the heat recovery system described such that the control module 12 can monitor the temperature of the jacket water returning to the reciprocating engine 1 and control jacket water flow to either the waste heat recovery system or to the engines radiator or to both via control valves 7.

If enough energy from the jacket water was not removed by the ORC system 4 prior to return back to the reciprocating engine 1, the engines radiator 8 may be configured in parallel to the above described system in some illustrative embodiments (Configurations 1, 2, and 3), thereby allowing the radiator 8 to remove additional thermal energy from the jacket water such that the two systems can operate in parallel. If controlling the return temperature of the jacket water to the engine is proving difficult in this arrangement, the operating it in series with control of the cooling fan for the radiator 8 may prove more effective (Configurations 4, 5, 6, 7, 8, 9, and 10).

The control module 12 may use heat diversion around TEG 2 and TFH 3, or jacket water to the radiator 8 such that the return temperature of the jacket is in the appropriate range. The control module 12 operating algorithm may be programmed to calculate the overall power generation from both the TEG 2 and the ORC system 4 so that the appropriate diversions are applied.

Various illustrative configurations for FIG. 4
Configuration 1:
1→2→3→5→1
Configuration 2:
1→2→3→15→1
Configuration 3:
1→2→3→6→1
Configuration 4:
1→2→3→5→8→1
Configuration 5:
1→2→3→15→8→1
Configuration 6:
1→2→3→6→8→1
Configuration 7:
1→8→2→3→5→1
Configuration 9:
1→8→2→3→15→1
Configuration 10:
1→8→2→3→6→1
Configuration 11:
1→2/8→3→5→1 (split flow between 2 and 8)
Configuration 12:
1→2/8→3→15→1 (split flow between 2 and 8)
Configuration 13:
1→2/8→3→6→1 (split flow between 2 and 8)
Configuration 14:
1→2→3→5→1/8→1 (split flow between 1 and 8)
Configuration 15:
1→2→3→15→1/8→1 (split flow between 1 and 8)
Configuration 16:
1→2→3→6→1/8→1 (split flow between 1 and 8)

Figure 5:
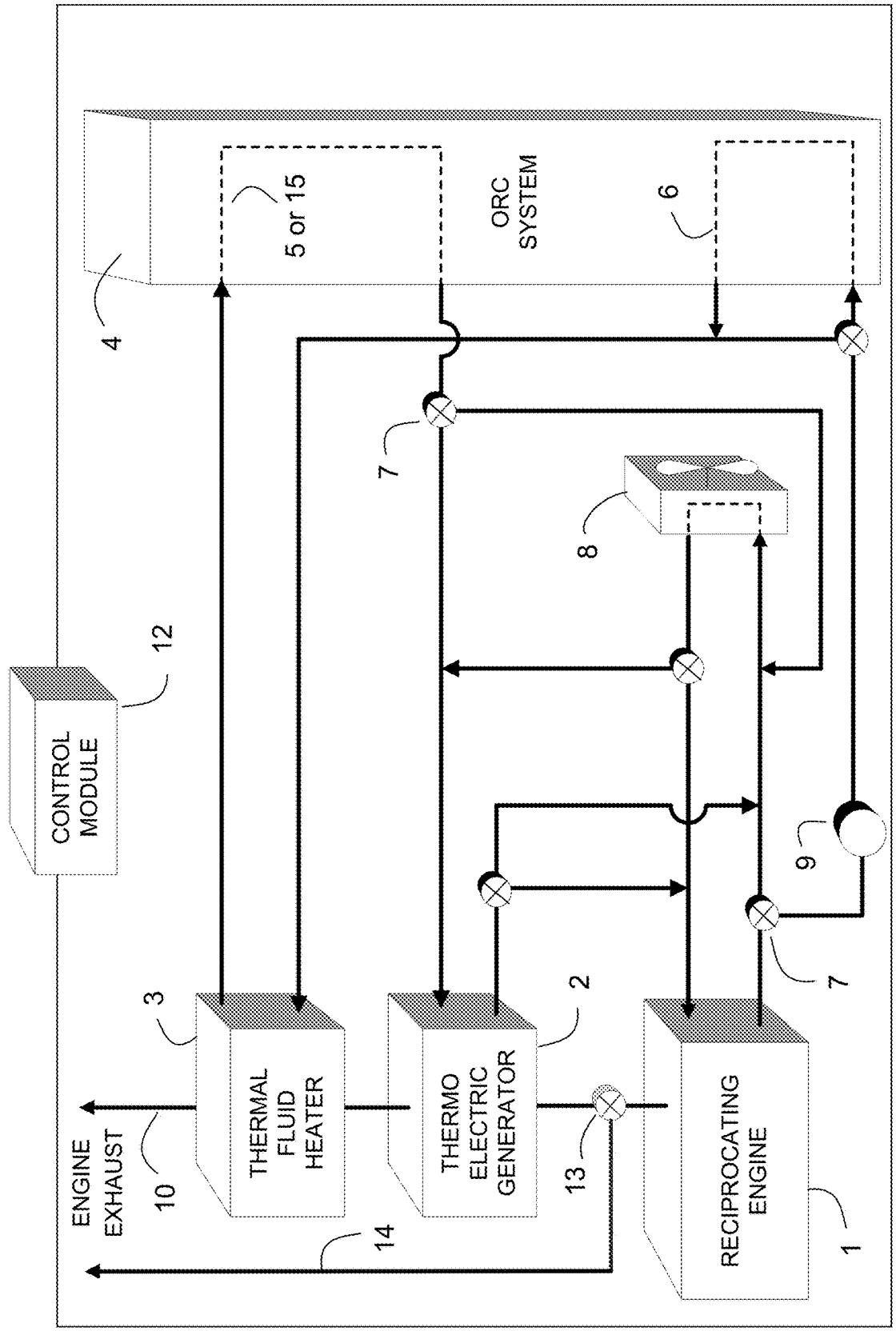
FIG. 5 shows yet another power generation system comprising a reciprocating engine, radiator, TEG, and thermal fluid heater coupled to an ORC system with circulating pumps control valves, wherein certain system controls may be provided by a control module under an illustrative embodiment.

FIG. 5 is similar to the embodiment of FIG. 4, where Configuration 12 (1→6→3→15→2→8→1) or Configuration 13 (1→6→3→15→8→2→1) may be considered the most comprehensive for this embodiment. It should be noted that heat exchanger 15 may be replaced with heat exchanger 5 or 6 if required on the ORC systems in certain illustrative embodiments. One difference between FIGS. 4 and 5 is that Configuration 12 of FIG. 5 uses the radiator 8 in the final stage to cool the jacket water before returning to the reciprocating engine, whereas Configuration 13 uses the radiator 8 to pre-cool the jacket water before entering TEG 2 which then discharges the jacket water to the reciprocating engine 1 to repeat the process. Both systems may comprise a reciprocating engine 1, radiator 8, pumps 9 (not all shown), valves 7, a control module 12, an exhaust TFH 3, a TEG 2, and an ORC system 4 (with heat exchangers 5 or 15, and 6).

Configuration 12 of FIG. 5 also differs from that described in FIG. 4 in that the heat gathering and dissipation is rearranged in a different order and the ORC system 4 uses two heat exchangers in place of one. Also, thermal energy from the reciprocating engine jacket water is transferred to the ORC system 4 at heat exchanger 6, where the jacket water is cooled, and is then pumped to THF 3 to pick up thermal energy from the exhaust. The heat energy picked up from the exhaust may be transferred to the jacket water which then looks to dispense of thermal energy into heat exchanger Mid-ORC 15. From here, the jacket water takes the path of picking up heat from TEG 2 before being cooled in radiator 8, prior to being returned to reciprocating engine 1.

In the configurations outlined below, the heat exchangers (High-ORC 5, or Mid-ORC 15, or Low-ORC 6) in ORC system 4 may be configured to extract more heat from the jacket water than would otherwise be removed by an ORC using an engines jacket water as a heat source—similar to that described in the configuration associated with FIG. 2. That is, the thermal energy rejected from the reciprocating engine 1 into the jacket water is what is typically designed into removal by an ORC system. In this case, the rejected heat to the jacket water may be exceed the usual amount of energy described above because any extra heat extracted can be added from the TFH 3 and the TEG 2 such that the amount of energy extracted by the ORC system 4 is as described. This alternating of heat-in, heat-out, heat-in, etc. also allows the system easier control when returning the jacket water to the reciprocating engine 1. Because the net thermal energy from the reciprocating engine is no different when operating without heat recovery, with controlled ORC system 4 heat recovery or with ORC system 4 plus TEG 2, the overall energy efficiency should be greatest with both TEG 2 and ORC system 4 recycling the waste heat. Meaning the power generated is greater (by approximately the amount generated by the TEG 2) even though the rejected heat from the engine is unchanged, as the TEG 2 relies on temperature differential to generate power, and not the conversion/absorption of thermal energy to create mechanical (to electrical) energy.

In the case where not enough thermal energy is removed from the jacket water or too much thermal energy is added to the engines jacket water (e.g., from the reciprocating engine 1, the TEG 2, or the TFH 3), the control module 12 can change control valves 7 position such that the engines existing radiator 8 be configured to be operated in parallel to the heat recovery system (as shown in Configurations 2, 5, 8, and 11) and can therefore be used to cool the jacket water by splitting the flow between the radiator 8 and the waste heat recovery system. Similarly to what is described in the previous figures/embodiments, the radiator 8 may be configured to operate either in series or in parallel to the heat recovery equipment. The control module 12 can use this configuration to adjust the returning jacket waters temperature to balance the optimal power generation from the waste heat equipment (TEG 2, TFH 3, ORC system 4) and the heat being rejected by the engine and subsequently from the TEG 2. The control module 12 has multiple control elements and control valves 7 (7a, 7b, 7e, 7f, and 7m) to activate to achieve the desired jacket water return temperature.

Various illustrative configurations for FIG. 5 are provided below.
Configuration 1:
1→8→1+14
Configuration 2:
1→3→5→2→1
Configuration 3:
1→3→5→2→8→1
Configuration 4:
1→3→5→8→2→1
Configuration 5:
1→3→15→2→1
Configuration 6:
1→3→15→2→8→1
Configuration 7:
1→3→15→8→2→1
Configuration 8:
1→6→3→5→2→1
Configuration 9:
1→6→3→5→2→8→1
Configuration 10:
1→6→3→5→8→2→1
Configuration 11:
1→6→3→15→2→1
Configuration 12:
1→6→3→15→2→8→1
Configuration 13:
1→6→3→15→8→2→1
Configuration 14:
1→3/8→5→2→1 (split flow between 3 and 8)
Configuration 15:
1→3/8→15→2→1 (split flow between 3 and 8)
Configuration 16:
1→3→5→2→1/8→1 (split flow between 1 and 8)
Configuration 17:
1→3→15→2→1/8→1 (split flow between 1 and 8)
Configuration 18:
1→3→5→2/8→8→1 (split flow between 2 and 8)
Configuration 19:
1→3→5→2/8→2→1 (split flow between 2 and 8)
Configuration 20:
1→3→5→2/8→1 (split flow between 2 and 8)
Configuration 21:
1→3→15→2/8→8→1 (split flow between 2 and 8)
Configuration 22:
1→3→15→2/8→2→1 (split flow between 2 and 8)
Configuration 23:
1→3→15→2/8→1 (split flow between 2 and 8)

Figure 6:
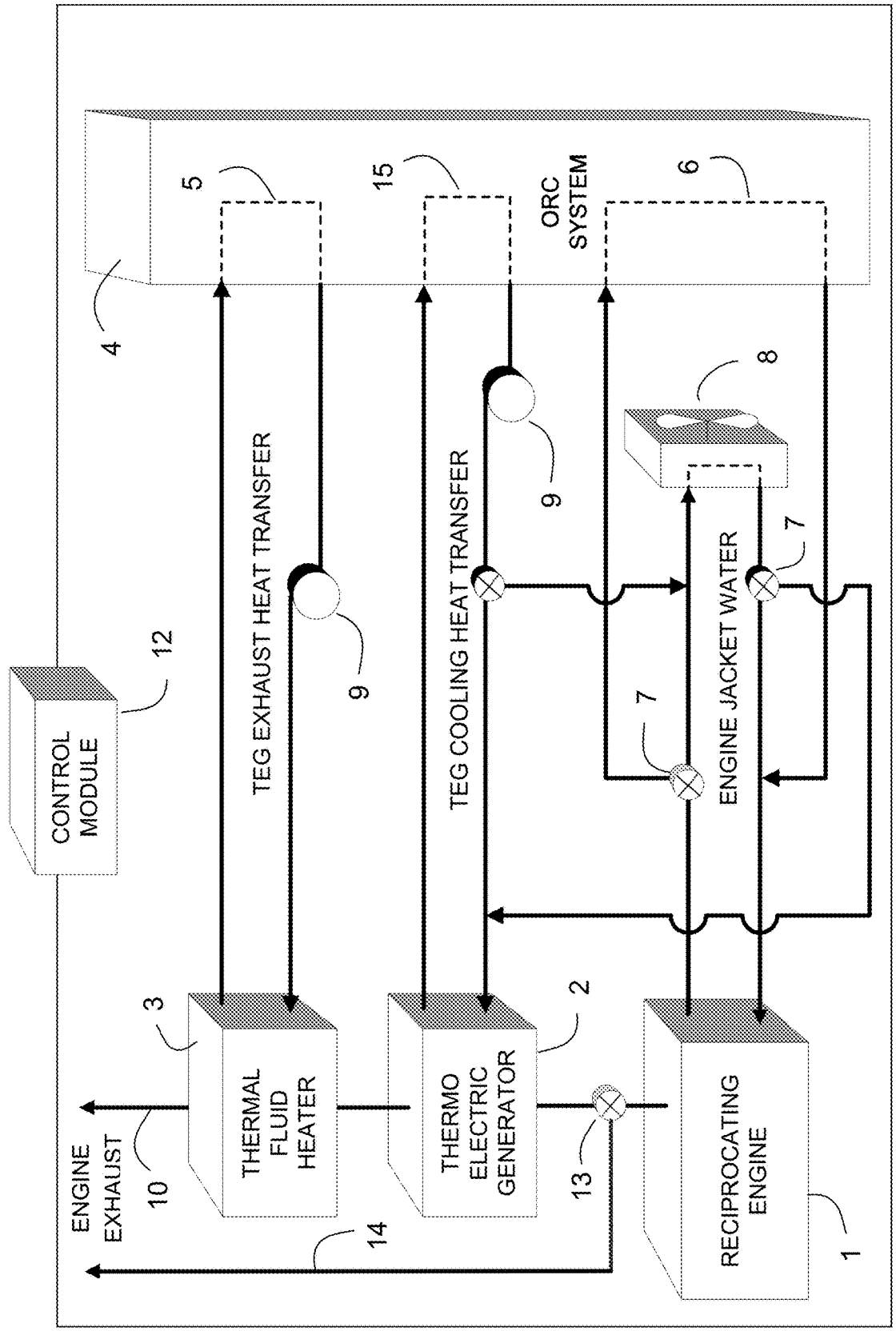
FIG. 6 shows yet another power generation system comprising a reciprocating engine, radiator, TEG, and thermal fluid heater coupled to an ORC system with circulating pumps control valves, wherein certain system controls may be provided by a control module, and wherein TEG exhaust heat transfer and TEG cooling heat transfer may be provided under an illustrative embodiment.

Turning to FIG. 6, in Configuration 7 below (1→6/8→1+2→15→8/2→2+3→5→3) the heat sources are all delivered in separate loops from one another to the ORC system 4. Specifically, in the loop labeled "ENGINE JACKET WATER" the reciprocating engines 1 jacket water discharge may be piped to the heat exchanger Low-ORC 6 where it is cooled in exchange with the ORC systems propellant. It is then circulated back to the reciprocating engine 1 to be reheated and re-circulated.

The loop labeled "TEG COOLING HEAT TRANSFER" uses a cooling fluid for the cooling of the TEG 2. It is piped to a heat exchanger in the ORC system 4 that is referred to as Mid-ORC 15 where it is cooled and returned by circulating pump 9 to the TEG 2 to pick up heat (and cool the TEG 2 simultaneously). The radiator 8 can operate in parallel to the "ENGINE JACKET WATER" loop or it can operate in series with the "TEG COOLING HEAT TRANSFER" loop. Configuration 7 uses the radiator 8 capacity such that it cools the jacket water before it reaches TEG 2. The final loop "TEG EXHAUST HEAT TRANSFER" recovers waste heat from the exhaust heat discharge from the TEG 2 via the TFH 3. Similarly a thermal heat transfer fluid is circulated between the TFH 3 and the heat exchanger High-ORC 5 in the ORC system 4. A circulating pump 9 circulates the heat transfer fluid.

The thermal fluid used in the engine may typically comprise a water/glycol mixture and can be used in the other loops, but the other two loops can use a heat conducting thermal fluid, thermal oil (synthetic or mineral), water or a water/glycol mixture. If the radiator 8 is to be operated in conjunction with the "TEG COOLING HEAT TRANSFER" loop then the fluids in the "ENGINE JACKET WATER" and "TEG COOLING HEAT TRANSFER" loops should be the same.

Various illustrative configurations for FIG. 6 are provided below

Configuration 1:
1→6/8→1+14
Configuration 2:
1→6→1+14
Configuration 3:
1→6/8→1+2→15→2
Configuration 4:
1→6/8→1+2→15→8/2→2
Configuration 5:
1→6/8→1+2→15→2
Configuration 6:
1→6/8→1+2→15→2+3→5→3
Configuration 7:
1→6/8→1+2→15→8/2→2+3→5→3
Configuration 8:
1→6/8→1+2→15→2+3→5→3
Configuration 9:
1→6/8→1+2→15→2+3→5→3

As discussed above, split flow may be provided at any of the control valves where flow can be split fully or partially to any downstream path from the control valve, thereby affecting heat transfer to downstream devices/equipment. In the example of FIG. 6, a split valve configuration on valve 7a would effectively allow the system to function as the "6/8" flow described above.

Figure 7:
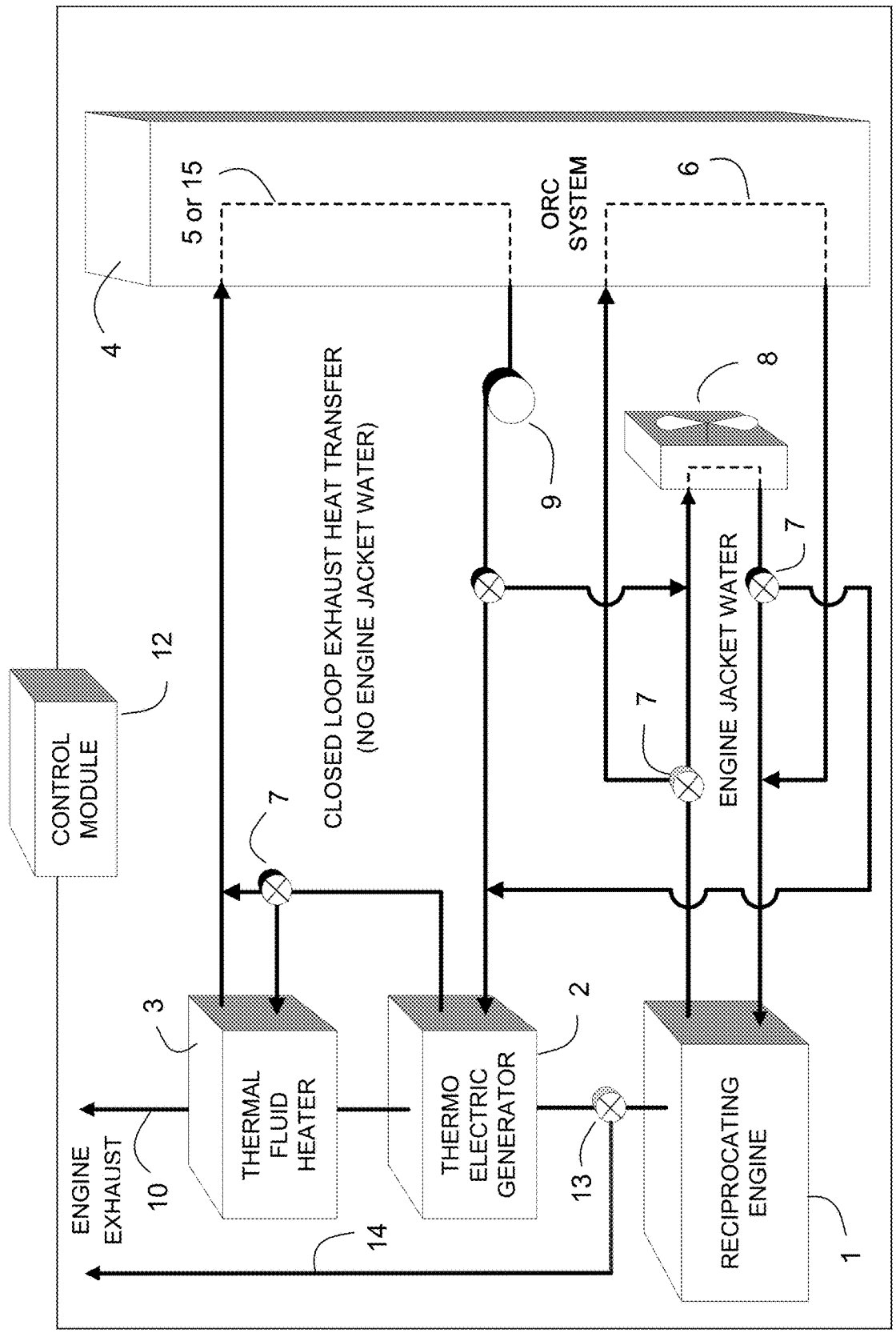
FIG. 7 shows yet another power generation system comprising a reciprocating engine, radiator, TEG, and thermal fluid heater coupled to an ORC system with circulating pumps control valves to provide closed loop exhaust heat transfer, wherein certain system controls may be provided by a control module under an illustrative embodiment.

The embodiment of FIG. 7 is similar to the jacket water configuration described in FIG. 6, except that the configuration of FIG. 7 varies by combining the thermal fluid loops of the "TEG COOLING HEAT TRANSFER" and the "TEG EXHAUST HEAT TRANSFER" described above into a single loop referred to as "CLOSED LOOP EXHAUST HEAT TRANSFER" loop, such that that thermal energy is delivered to the ORC system 4 in a combined manner to heat exchanger High-ORC 5 or Mid-ORC 15. The balance of the system in the loop "ENGINE JACKET WATER" remains unchanged. Similarly, the radiator 8 can operate in parallel or in series to the "ENGINE JACKET WATER" loop or it can operate in series or in parallel with the "CLOSED LOOP EXHAUST HEAT TRANSFER" loop, depending on how the control module diverts the flow through the control valves 7.

The system control applied by control module 12 may be similar to the previously described systems such that it will be predicated on returning the jacket water to the reciprocating engine 1 at the appropriate temperature. The remainder of the system may operate to maximize power generation. One consideration that may reduce absolute maximum power generation is the limitation on the reduction of the engine exhaust gas temperature. When the temperature of the engine exhaust is lowered too much (below the dew point), the exhaust gases may start condensing in the exhaust piping system which can lead to equipment problems and therefore a minimum exhaust temperature may be required for both plume dispersion and for preventing the creation of undesirable condensates in the exhaust piping.

The below Configuration 5 (1→6/8→1+2→3/5→5→8/2→2) may be one of numerous preferred arrangements for waste heat recovery from reciprocating engines 1 because it keeps the reciprocating engines 1 jacket water system separate from the other waste recovery loop. This allows the ORC system 4 (by heat exchanger Low-ORC 6) to remove the appropriate amount of heat from the jacket water to return it to the engine at the right temperature (which can be accomplished through sizing of the heat exchanger Low-ORC 6) where this heat exchanger can then perform the evaporative function of the propellant in the ORC system 4, which then in effect sets the flow rate for the ORC system 4.

This use of engine jacket water then allows the other wasted thermal energy from the reciprocating engines exhaust (the balance of the heat recovery system) to be used for either pre-heating the propellant in the ORC system 4, or for superheating the propellant in the ORC system 4. In other words, this configuration may allow the reciprocating engine 1 to operate independently (and use its internal thermostatic valve to vary the jacket water flow rate to Low-ORC 6) as well as permit the ORC system 4 to operate independently by establishing the flow rate in the ORC system 4 by the amount of propellant that gets evaporated by this heat stream. Therefore, by diverting the jacket cooling function from the radiator 8 to the ORC system 4, the capacity of the radiator 8 can be used in series with the "CLOSED LOOP EXHAUST HEAT TRANSFER" loop to cool the thermal fluid in that loop. This will increase the temperature delta at the TEG 2 and thereby increase the efficiency of the TEG 2 and the overall system.

Diversion of thermal fluid around TFH 3 by control valve 7 is another technique/method used by control module 12 that is shown in this configuration.

Various illustrative configurations for FIG. 7
Configuration 1:
1→6→1+14
Configuration 2:
1→6→1+2→5→2
Configuration 3:
1→6→1+2→5→8→2
Configuration 4:
1→6→1+2→3→5→2
Configuration 5:
1→6→1+2→3→5→8→2
Configuration 6:
1→6→1+2→15→2
Configuration 7:
1→6→1+2→15→8→2
1→6→1+2→3→15→2
Configuration 9:
1→6→1+2→3→15→8→2
Configuration 10:
1→8→1+14
Configuration 11:
1→8→1+2→5→2
Configuration 12:
1→8→1+2→15→2
Configuration 13:
1→8→1+2→3→5→2
Configuration 14:
1→8→1+2→3→15→2

Configuration 15:
1→6/8→1+14
Configuration 16:
1→6/8→1+2→5→2 ETC.

Figure 8:
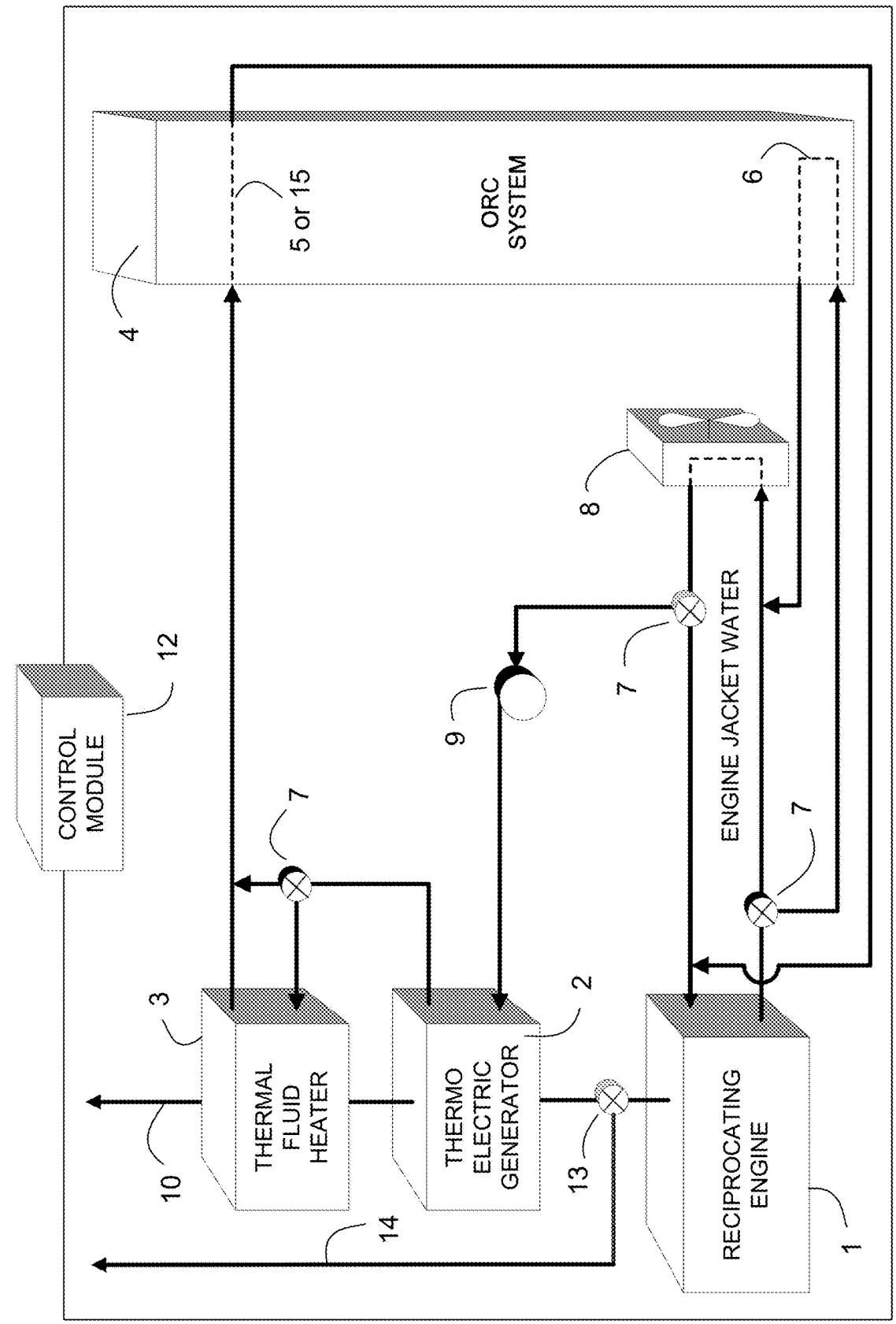
FIG. 8 shows yet another power generation system comprising a reciprocating engine, radiator, TEG, and thermal fluid heater coupled to an ORC system with circulating pumps control valves, wherein certain system controls may be provided by a control module under an illustrative embodiment.

The embodiment of FIG. 8 illustrates that the engines radiator 8 may be available to be operated in series or in partial-parallel (by splitting the flow to the radiator 8 and other components simultaneously) to the entire heat recovery system. In some illustrative embodiments, partial-parallel flow may be configured at any control valve, depending on the application. When heat recovery is desired, the reciprocating engines radiator 8 becomes integral to the heat recovery system and is used in series. In some illustrative embodiments, the flow from the reciprocating engine 1 can be split between the radiator 8 and heat exchanger Low-ORC 6. This split flow will provide heat to the ORC system 4 and cooling the balance of the jacket water from the engine, thereby creating a proportioning flow system that can be used for jacket water return temperature control. In some illustrative embodiments, the return temperature of the jacket water to the reciprocating engine can be controlled by the control module 12 by either flow diversion through any of the control valves (e.g., 7) or by diverting reciprocating engine exhaust gases using valve 13 into the engine exhaust pipe 14 around the TEG 2 and TFH 3 such that the circulating fluid will not capture as much heat from the reciprocating engines exhaust, or split the exhaust flow between exhaust pipe 10 (with the two heat recovery elements) and exhaust pipe 14.

In one example, shown in Configuration 7 (1→6→8→2→3→5→1) below, the engines jacket water is first circulated to the ORC systems heat exchanger Low-ORC 6 which cools the jacket water. It is then circulated to the reciprocating engines radiator 8 for additional cooling. The jacket water then is piped to the TEG 2 to provide the TEG cooling. This is one of the coolest streams of jacket water possible in the described configurations because it is cooled in series by the ORC system and the reciprocating engines radiator 8, thereby providing the largest temperature delta to the TEG 2. The jacket water is then heated by the TEG 2 (while cooling the TEG 2) and is then heated by the remaining recoverable (to the lower temperature limit) energy in the reciprocating engines exhaust that discharges from the TEG 2 in the thermal fluid heater TFH 3. The jacket water is then piped to the ORC systems heat exchanger High-ORC 5 or Mid-ORC 15. The jacket water is cooled here and then returned to the reciprocating engine 1 to repeat the process.

As shown in the other configurations, the control module 12 could bypass or split (the flows to the radiator 8 and Low-ORC 6) the jacket waters flow to the heat exchanger Low-ORC 6 in the process and still have the system function. The jacket water would circulate to the reciprocating engines radiator 8, then the TEG 2, then to the TFH 3, then the High-ORC 5 heat exchanger to then return to the reciprocating engine 1. This method could be another way to control the jacket waters return temperature to the reciprocating engine 1. The configuration of the two heat streams in the ORC is to be arranged such that the lower temperature fluid is used by the ORC before the higher temperature fluid such that energy is being transferred to the ORC propellant.

Various illustrative configurations for FIG. 8
Configuration 1:
1→8→2→5→1
Configuration 2:
1→8→2→15→1
Configuration 3:
1→8→2→3→5→1
Configuration 4:
1→8→2→3→15→1
Configuration 5:
1→6→8→2→5→1
Configuration 6:
1→6→8→2→15→1
Configuration 7:
1→6→8→2→3→5→1
Configuration 8:
1→6→8→2→3→15→1
Configuration 9:
1→6/8→2→5→1 (split flow between 6 and 8)
Configuration 10:
1→6/8→2→15→1 (split flow between 6 and 8)
Configuration 11:
1→6/8→2→3→5→1 (split flow between 6 and 8)
Configuration 12:
1→6/8→2→3→15→1 (split flow between 6 and 8)

Figure 9:
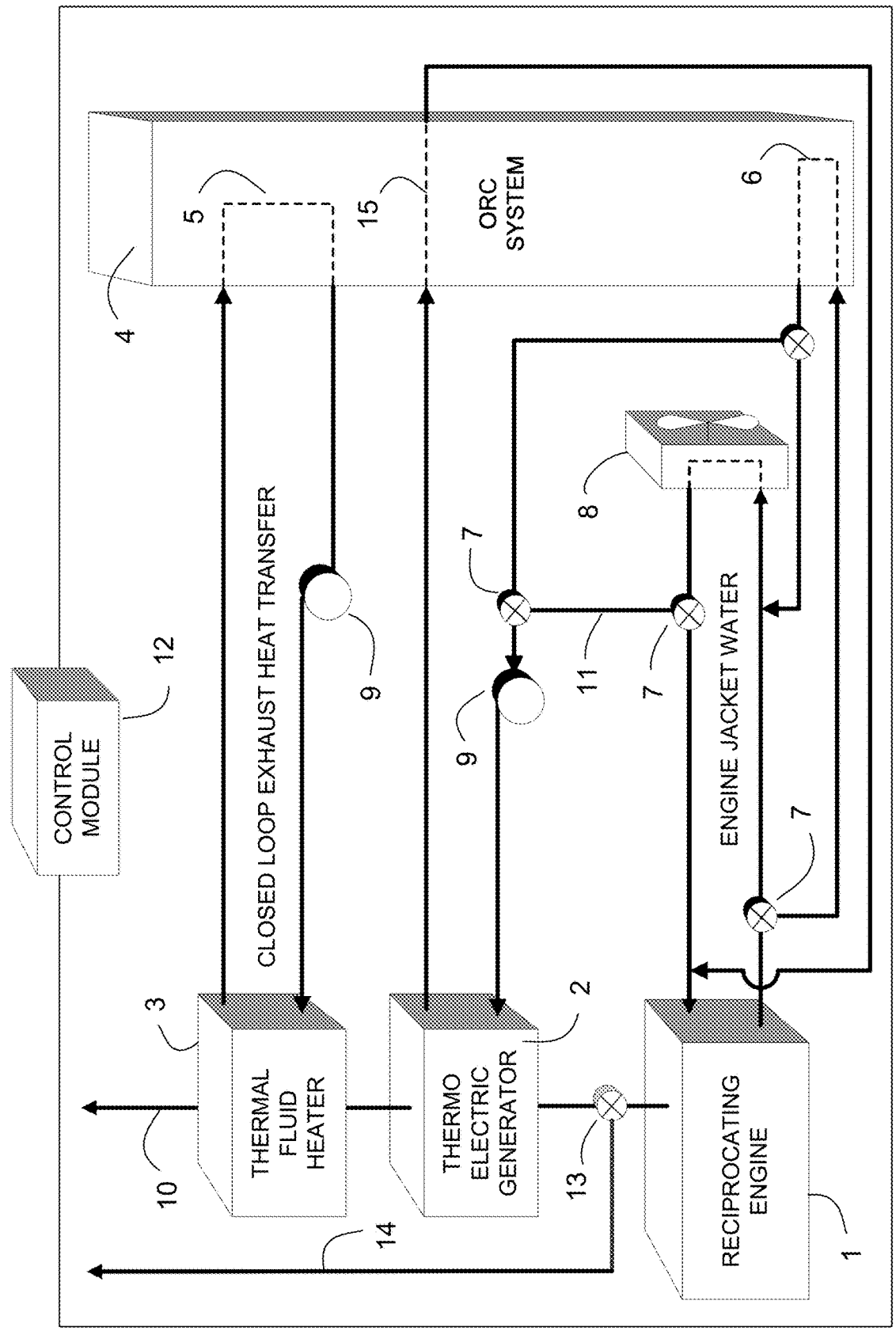
FIG. 9 shows yet another power generation system comprising a reciprocating engine, radiator, TEG, and thermal fluid heater coupled to an ORC system with circulating pumps control valves to provide closed loop exhaust heat transfer, wherein certain system controls may be provided by a control module under an illustrative embodiment.

The embodiment of FIG. 9 is similar to the jacket water configuration described in FIG. 6, except that the configuration of FIG. 9 varies by combining the thermal fluid loops of the "TEG COOLING HEAT TRANSFER" and the "ENGINE JACKET WATER" described above into a single loop, such that that thermal energy is delivered to the ORC system 4 in a combined manner to heat exchanger Low-ORC 6 or Mid-ORC 15. This allows the engines existing radiator 8 to be connected in either series or parallel with this combined heat recovery loop such that the jacket water return temperature can be easily controlled by the control module 12.

Configurations 1, 2 and 3 described below depict the reciprocating engines radiator 8 operating in parallel, whereas the other configurations (4 thru 8) show the radiator 8 operating in series with the waste heat recovery system.

Configuration 3 (1→6→2→15→1+3→5→3) shows the reciprocating engines radiator fluid circulated to the ORC system's 4 heat exchanger Low-ORC 6 (for jacket water cooling), then to TEG 2 for TEG 2 cooling (heat gain in the jacket water), then to the Mid-ORC 15 (for jacket water cooling), then back to the reciprocating engine 1 (heat gain in the jacket water) with the other loop comprising of THF 3, ORC system 4 heat exchanger High-ORC 5 and a circulating pump. The thermal fluid in this loop circulates between THF 3 and the ORC system 4. System control will be as previously described such that the return jacket water temperature is kept at the temperature required to keep the engines thermostatic valve open and jacket water flow unaffected while at the same time, insuring that the reciprocating engine does not overheat nor cause the engines thermostatic valve to modulate and vary the engine jacket water flow rate which in effect would affect the ORC's and TEG's performance. As explained above in FIG. 8, the control module 12 can split the jacket water flow discharging from the engine to Low-ORC 6 and the radiator 8. As illustrative examples, Configurations 9, 10, 11 show these split flow configurations.

Various illustrative configurations for FIG. 9
Configuration 1:
1→6→1+14
Configuration 2:
1→6→1+3→5→3
Configuration 3:
1→6→2→15→1+3→5→3
Configuration 4:
1→6→8→1+14

Configuration 5:
1→6→8→1+3→5→3
Configuration 6:
1→6→8→2→15→1+3→5→3
Configuration 7:
1→8→1+14
Configuration 8:
1→8→2→15→1+3→5→3
Configuration 9:
1→6/8→1+14 (split flow between 6 and 8)
Configuration 10:
1→6/8→1+3→5→3 (split flow between 6 and 8)
Configuration 11:
1→6/8→2→15→1+3→5→3 (split flow between 6 and 8)

Figure 10:
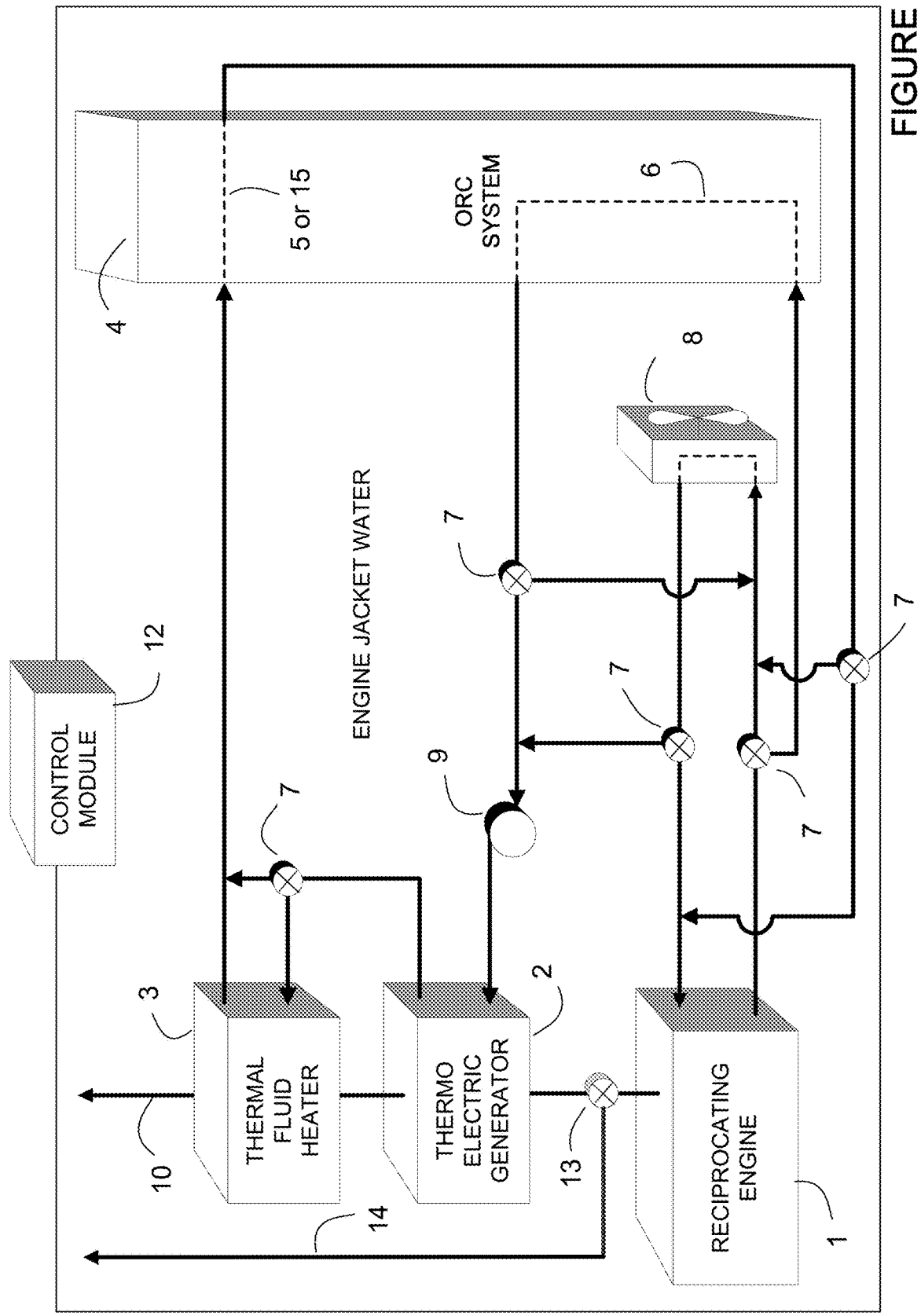
FIG. 10 shows yet another power generation system comprising a reciprocating engine, radiator, TEG, and thermal fluid heater coupled to an ORC system with circulating pumps control valves, wherein certain system controls may be provided by a control module under an illustrative embodiment.

The embodiment of FIG. 10 is similar to that described in FIG. 4 above, but differs in that the engines jacket water is sent to the ORC system 4 to be cooled twice, in place of once. It also shows the addition of a circulation pump as the engines jacket water pump is only suitable to limited back pressure and a booster pump would more than likely be required.

In configuration 1 (1→6→2→3→5→1) below, the reciprocating engines 1 radiator 8 is configured in parallel to the heat recovery loop. This allows for fine tuning of the jacket water temperature on return to the reciprocating engine 1 by either split flow control or complete flow redirection (applicable to listed Configurations). The split flow approach allows the tuning of the return temperature of the engine jacket water such that the engines thermostatic valve remains open. The flow path for the jacket water may be configured from the reciprocating engine 1 to the ORC systems 4 heat exchanger Low-ORC 6, then to a booster pump 9 (which can be located anywhere in the loop), then to the TEG 2, then to the TFH 3, then to the ORC systems heat exchanger High-ORC 5 to then return to the reciprocating engine 1.

The jacket water picks up heat from the reciprocating engine 1, the TEG 2, and the TFH 3, and transfers that heat energy collected to the ORC system 4 at the various heat exchangers High-ORC 5, Low-ORC 6. As previously mentioned, it is important that the delivery of the jacket water to the ORC system 4 is done so with lower temperature jacket water to the lower enthalpy location in the ORC systems propellant loop, such that the higher temperature jacket water is transferring heat energy to the other heat exchanger in the ORC where the temperature of the propellant is lower than the jacket water coming into the ORC process. The jacket water does not necessarily have to be delivered into the ORC in the order in which the heat exchangers are labeled. This is done only for convenience of communication of concepts via drawings and specification.

Various illustrative configurations for FIG. 10
Configuration 1:
1→6→2→3→5→1
Configuration 2:
1→6→2→3→5→8→1
Configuration 3:
1→6→2→3→15→1
Configuration 4:
1→6→2→3→15→8→1
Configuration 5:
1→6→2→5→1
Configuration 6:
1→6→2→5→8→1
Configuration 7:
1→6→2→15→1
Configuration 8:
1→6→2→15→8→1
Configuration 9:
1→6→8→2→5→1
Configuration 10:
1→6→8→2→15→1
Configuration 11:
1→6→8→2→3→5→1
Configuration 12:
1→6→8→2→3→15→1
Configuration 13:
1→8→2→3→5→1
Configuration 14:
1→8→2→3→15→1
Configuration 15:
1→8→2→5→1
Configuration 16:
1→8→2→15→1

Figure 11:
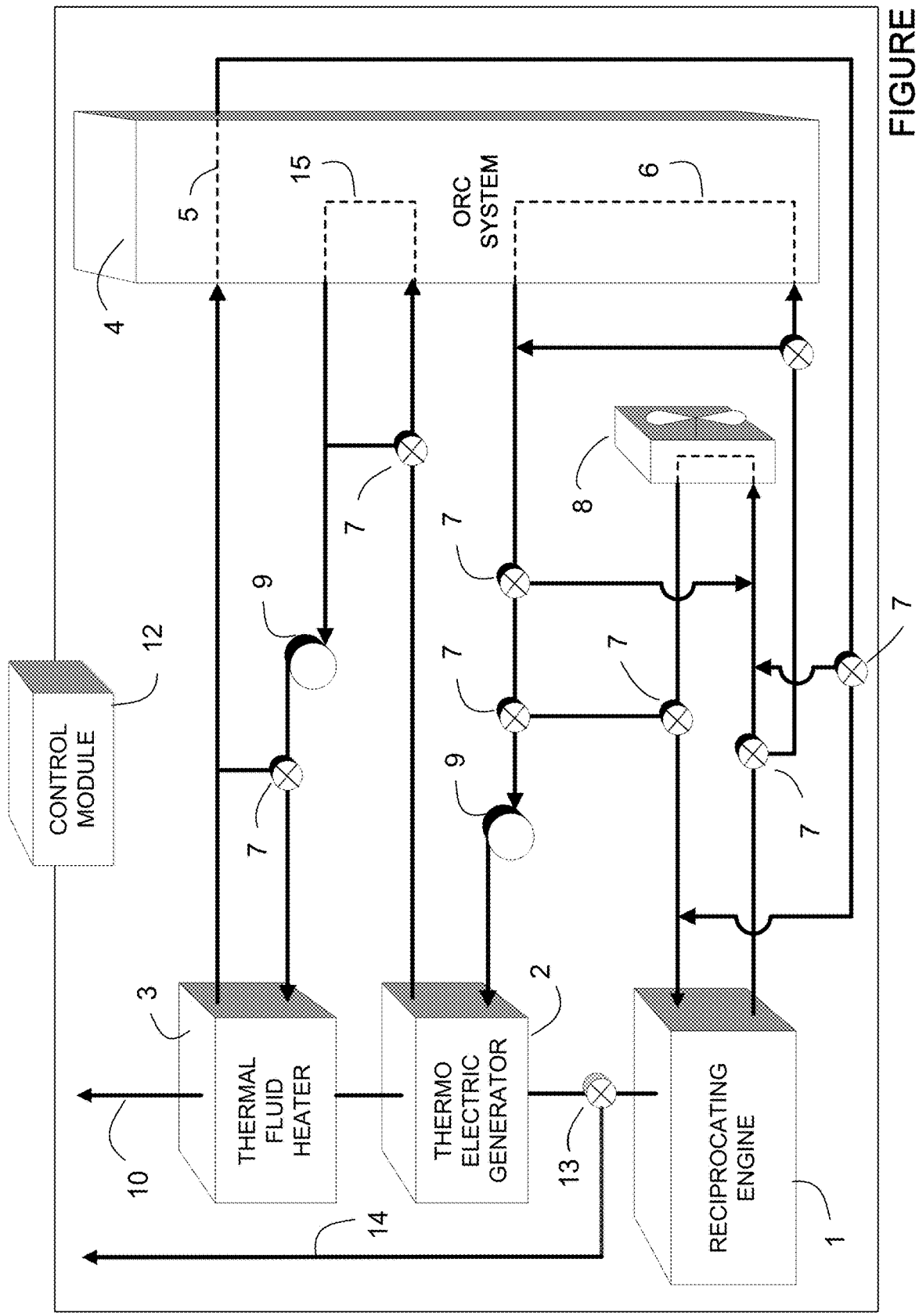
FIG. 11 shows yet another power generation system comprising a reciprocating engine, radiator, TEG, and thermal fluid heater coupled to an ORC system with circulating pumps control valves, wherein certain system controls may be provided by a control module under an illustrative embodiment.

The embodiment of FIG. 11 is similar to the embodiment of FIG. 10. Configuration 7 (1→6→2→15→3→5→1) of FIG. 11 shown below, is the same as that described in FIG. 10 between the jacket water inlet to the reciprocating engine 1 until the jacket water is discharged from the TEG 2. From this point, rather than the jacket water going to the TFH 3, the jacket water is sent to the ORC systems 4 heat exchanger Mid-ORC 15. The jacket water is cooled there and then returned to the TFH 3 to pick up additional heat. From here, the jacket water is sent to the ORC system 4 for its last cooling (in High-ORC 5) before returning to the reciprocating engine 1 to restart the process.

In the embodiment of FIG. 11, there are two bypass piping arrangements which would allow the control module 12 to divert jacket water around Mid-ORC 15 if the return temperature of the jacket water needed to be warmer on return to the engine or if the opposite were required (the jacket water is too warm on return to the reciprocating engine) the other bypass around TFH 3 could be avoided so that less thermal energy makes it into the jacket water. Configuration 10 (1→6→2→3→5→8→1) is very similar to Configuration 7 (1→6→2→15→3→5→1) with the exception that the heat exchanger Mid-ORC 15 is being diverted around, and the engine radiator 8 is being used in series just before returning the jacket water to the reciprocating engine 1. Whereas in Configuration 7 (1→6→2→15→3→5→1) the reciprocating engines 1 radiator 8 is configured in parallel to the heat recovery loop. This allows for fine tuning of the jacket water temperature on return to the reciprocating engine 1. Specifically, the control valves 7 do not necessarily have to restrict flow entirely, but can proportion flow to the various components through the various piping combinations shown.

Various illustrative configurations for FIG. 11
Configuration 1:
1→2→3→5→1
Configuration 2:
1→2→3→5→8→1
Configuration 3:
1→2→15→5→1
Configuration 4:
1→2→15→5→8→1
Configuration 5:
1→2→15→3→5→1
Configuration 6:
1→2→15→3→5→8→1
Configuration 7:
1→6→2→15→3→5→1
Configuration 8:
1→6→2→15→3→5→8→1

Configuration 9:
1→6→2→3→5→1
Configuration 10:
1→6→2→3→5→8→1
Configuration 11:
1→6→2→15→5→1
Configuration 12:
1→6→2→15→5→8→1
Configuration 13:
1→6→8→2→15→3→5→1
Configuration 14:
1→6→8→2→15→5→1
Configuration 15:
1→6→8→2→3→5→1
Configuration 16:
1→6→8→2→5→1
Configuration 17:
1→8→2→15→3→5→1
Configuration 18:
1→8→2→15→5→1
Configuration 19:
1→8→2→3→5→1
Configuration 20:
1→8→2→5→1

Figure 12:
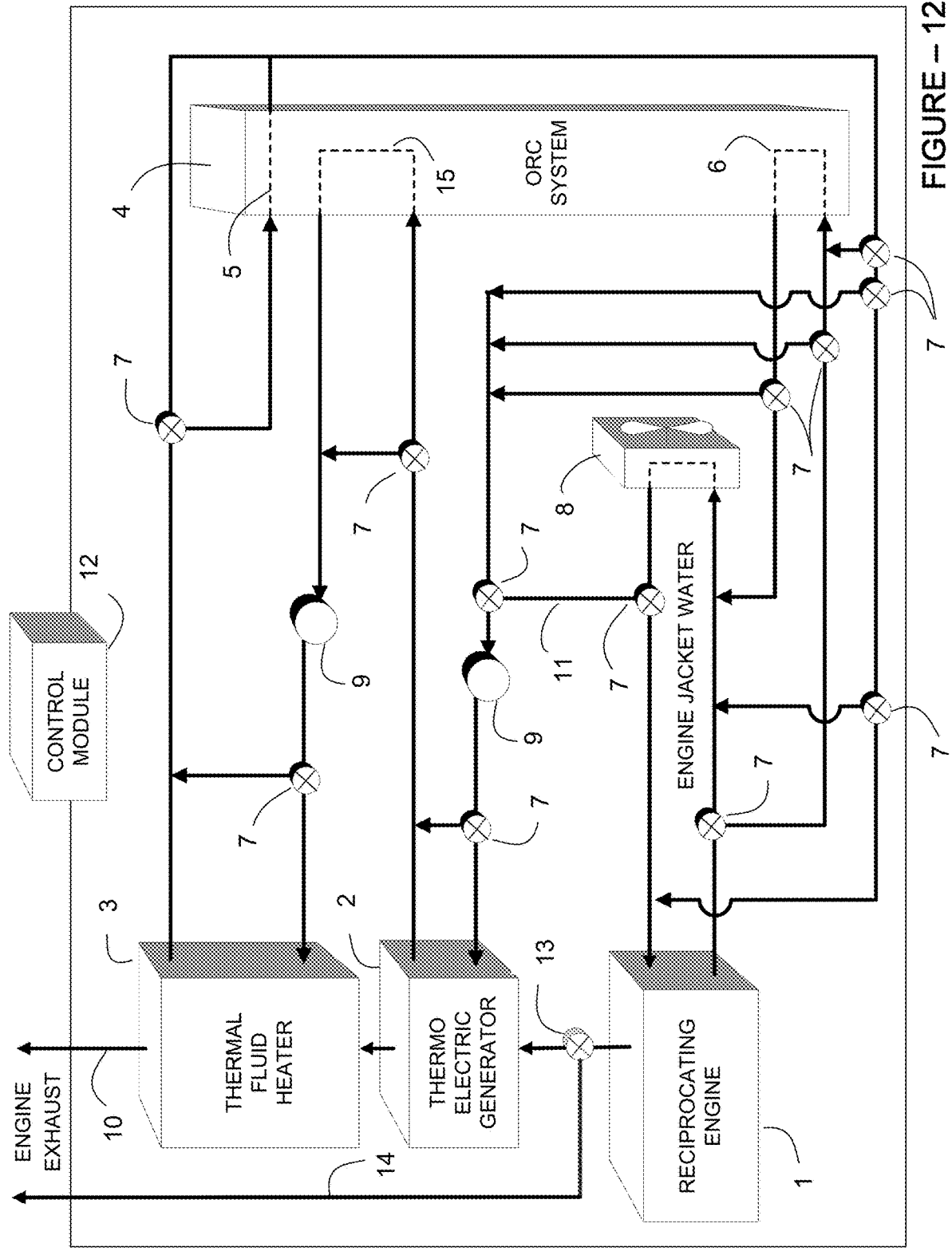
FIG. 12 shows yet another power generation system comprising a reciprocating engine, radiator, TEG, and thermal fluid heater coupled to an ORC system with circulating pumps control valves, wherein certain system controls may be provided by a control module under an illustrative embodiment.

The embodiment of FIG. 12 is unique in comparison to the previously described configurations in that the ORC system heat exchanger Low-ORC 6 can be used early in the heat transfer process or at the end of the heat transfer process. In other words, depending on where the jacket water temperatures are landing with a specific engine, it may be beneficial to use heat exchanger Low-ORC 6 for pre-heating or evaporating or superheating propellant (depending on the ORC's propellant used and system pressure) before the jacket water is returned to the reciprocating engine 1.

As described in elsewhere herein, the reciprocating engine radiator 8 can be operated in series or in parallel to the waste heat recovery system. This may be accomplished by the addition of pipe spool 11 which depending on the case, can see flow in either direction depending on the valve 7 configurations applied by the control module 12. Additionally, splitting the jacket water flow (whether configured to operate the radiator 8 in series or in parallel), diverting partial flow to the radiator and allowing the fluids to circulate, final adjustment of the returning jacket water can be made when the radiator is operated near the end of the jacket waters circulation, before returning to the reciprocating engine 1. This concept is applicable to other flows passing through control valves where the control valve would divert fluid (or exhaust) flow to varying components and by changing the flow, the amount of energy delivered also varies, causing the receiving equipment to operate differently than it would with different flow rate delivered to it.

Similarly to the embodiments in FIGS. 3, 6, 7, 9, the system of FIG. 12 can also be operated as two separate thermal loops where the reciprocating engine 1 and the radiator 8 operate independently from the TEG 2 and the ORC system 4. This may be accomplished by the control module 12 adjusting control valves 7 such that flow of engine radiator fluid from the reciprocating engine is isolated to flow only from the reciprocating engine 1 to the radiator 8 and back to the reciprocating engine 1. This leaves the balance of the waste heat system isolated from the radiator fluid where the fluid in that part of the system is circulated by circulation pump 9.

Similar to the previously described configurations (FIGS. 1, 2, 4, 5, 8, 10, and 11) where the reciprocating engine 1 jacket water is circulating throughout the waste heat system, the system of FIG. 12 can include: reciprocating engine 1, jacket water cooling fluid, TEG 2, TFH 3, ORC system 4, High-ORC 5, Mid-ORC 15 (not shown), Low-ORC 6, Control valves 7, Reciprocating engine radiator 8, Circulating pump(s) 9, Engine exhaust pipe 10 and 14, Pipe spool 11, Control module 12, and Exhaust control valve 13. With the addition of pipe spool 11, fluid can flow in either direction, depending on whether the reciprocating engine radiator is operated in series or in parallel to the waste heat recovery system.

As in the previously described configurations, one objective in the embodiment of FIG. 12 is similar—to maximize reciprocating engine efficiency by controlling the fluid flow through the various components, all the while targeting the fluid temperature returning to the reciprocating engine to be at the target temperature range so that the engines thermostatic valve does not restrict jacket water discharge from the reciprocating engine 1 nor does it allow the engine to overheat due to inadequate cooling of the jacket water.

One of the sub-objectives influencing the control modules 12 algorithms or self learning (artificial intelligence) software should be to minimize the temperature of the jacket water entering the TEG 2 so as to increase the delta across the TEG 2. Another factor to be programmed into the control algorithm is the operation of the ORC system 4. That is, fluid temperature and flow should be compared to the result that will be achieved in the ORC system 4 versus the TEG 2, all the while insuring that the return temperature of the reciprocating engine jacket water has extracted the appropriate thermal energy from the engine such that the thermostatic valve inherent to the engine does not module unnecessarily. The algorithm will need to compare the expected output while also modulating flow in the system to extract the correct amount of thermal energy from the reciprocating engines jacket water to achieve the appropriate return temperature of the jacket water to the reciprocating engine 1.

The piping arrangement shown allows for cooling in the existing radiator either before reaching the TEG (with the objective to reduce the temperature of the jacket water to the TEG's inlet for the purpose of increasing the temperature delta across the TEG to increase it efficiency) or after the TEG (prior to return to the engine) so that the system does not affect the engines internal thermostatic (temperature dependent position) valve or in extreme conditions, overheat and shut down the engine or modulate flow to increase the jacket waters temperature by having a longer residence time in the engine.

Similar to the description in FIG. 11, the configuration of FIG. 12 can bypass the TEG 2, the Mid-ORC 15, the TFH 3, and in addition can bypass around the ORC system's 4 heat exchanger High-ORC 5. Therefore, between the addition of jacket water flow through the reciprocating engine 1 radiator 8 in series or parallel and bypass on the heat producing and heat consuming elements of the waste heat system, the control module can maximize the efficiency of the reciprocating engine 1 by manipulating the flow of fluids through the collection and rejection of heat from the reciprocating engine using the TEG 2, ORC system 4, and engine radiator 8.

Through the various flow paths, by controlling the control valves 7, virtually any combination of components can be used to either input heat into the thermal fluids or take heat out of the thermal fluids such that the objective of optimized efficiency is achieved without disrupting the operation of the reciprocating engine 1.

Various illustrative configurations for FIG. 12

Configuration 1:
1→2→3→1
Configuration 2:
1→2→3→5→1
Configuration 3:
1→2→3→5→8→1
Configuration 4:
1→2→3→5→6→1
Configuration 5:
1→2→3→5→6→8→1
Configuration 6:
1→2→3→6→1
Configuration 7:
1→2→3→6→8→1
Configuration 8:
1→2→3→8→1
Configuration 9:
1→2→5→1
Configuration 10:
1→2→5→6→1
Configuration 11:
1→2→5→6→8→1
Configuration 12:
1→2→5→8→1
Configuration 13:
1→2→6→8→1
Configuration 14:
1→2→6→1
Configuration 15:
1→2→8→1
Configuration 16:
1→2→15→3→1
Configuration 17:
1→2→15→3→5→1
Configuration 18:
1→2→15→3→5→8→1
Configuration 19:
1→2→15→3→6→1
Configuration 20:
1→2→15→3→6→8→1
Configuration 21:
1→2→15→5→1
Configuration 22:
1→2→15→5→6→1
Configuration 23:
1→2→15→5→6→8→1
Configuration 24:
1→2→15→5→8→1
Configuration 25:
1→2→15→6→1
Configuration 26:
1→2→15→6→8→1
Configuration 27:
1→2→15→1
Configuration 28:
1→2→1
Configuration 29:
1→3→5→8→1
Configuration 30:
1→3→5→1
Configuration 31:
1→3→6→8→1
Configuration 32:
1→3→6→1
Configuration 33:
1→5→6→8→1
Configuration 34:
1→5→6→1
Configuration 35:
1→5→8→1
Configuration 36:
1→5→1
Configuration 37:
1→6→2→3→1
Configuration 38:
1→6→2→3→5→1
Configuration 39:
1→6→2→3→5→8→1
Configuration 40:
1→6→2→3→8→1
Configuration 41:
1→6→2→5→1
Configuration 42:
1→6→2→5→8→1
Configuration 43:
1→6→2→8→1
Configuration 44:
1→6→2→15→1
Configuration 45:
1→6→2→15→3→1
Configuration 46:
1→6→2→15→3→5→1
Configuration 47:
1→6→2→15→3→8→1
Configuration 48:
1→6→2→15→5→1
Configuration 49:
1→6→2→15→5→8→1
Configuration 50:
1→6→2→15→8→1
Configuration 51:
1→6→2→1
Configuration 52:
1→6→3→5→1
Configuration 53:
1→6→3→5→8→1
Configuration 54:
1→6→3→8→1
Configuration 55:
1→6→3→1
Configuration 56:
1→6→5→8→1
Configuration 57:
1→6→5→1
Configuration 58:
1→6→8→2→1
Configuration 59:
1→6→8→2→15→1
Configuration 60:
1→6→8→2→15→3→1
Configuration 61:
1→6→8→2→15→3→5→1
Configuration 62:
1→6→8→2→15→5→1
Configuration 63:
1→6→8→2→3→1
Configuration 64:
1→6→8→2→3→5→1
Configuration 65:
1→6→8→2→5→1

Configuration 66:
1→6→8→2→1
Configuration 67:
1→6→8→2→15→1
Configuration 68:
1→6→8→2→15→3→5→1
Configuration 69:
1→6→8→2→15→5→1
Configuration 70:
1→6→8→2→3→1
Configuration 71:
1→6→8→2→3→5→1
Configuration 72:
1→6→8→2→5→1
Configuration 73:
1→6→8→1
Configuration 74:
1→6→1
Configuration 75:
1→8→2→3→1
Configuration 76:
1→8→2→3→5→1
Configuration 77:
1→8→2→3→5→6→1
Configuration 78:
1→8→2→3→6→1
Configuration 79:
1→8→2→5→1
Configuration 80:
1→8→2→5→6→1
Configuration 81:
1→8→2→6→1
Configuration 82:
1→8→2→8→1
Configuration 83:
1→8→2→15→1
Configuration 84:
1→8→2→15→3→1
Configuration 85:
1→8→2→15→3→5→1
Configuration 86:
1→8→2→15→3→6→1
Configuration 87:
1→8→2→15→5→1
Configuration 88:
1→8→2→15→6→1
Configuration 89:
1→8→2→15→3→6→1
Configuration 90:
1→8→2→15→3→5→6→1
Configuration 91:
1→8→2→1
Configuration 92:
1→8→3→5→1
Configuration 93:
1→8→3→5→6→1
Configuration 94:
1→8→3→6→1
Configuration 95:
1→8→3→1
Configuration 96:
1→8→5→6→1
Configuration 97:
1→8→5→1
Configuration 98:
1→8→6→1
Configuration 99:
1→8→8→1
Configuration 100:
1→8→15→3→1
Configuration 101:
1→8→15→3→5→1
Configuration 102:
1→8→15→3→6→1
Configuration 103:
1→8→15→5→1
Configuration 104:
1→8→15→5→6→1
Configuration 105:
1→8→15→6→1
Configuration 106:
1→8→15→1
Configuration 107:
1→8→1
Configuration 108:
1→15→3→5→1
Configuration 109:
1→15→3→5→8→1
Configuration 110:
1→15→3→6→1
Configuration 111:
1→15→3→6→8→1
Configuration 112:
1→15→3→1
Configuration 113:
1→45→5→6→1
Configuration 114:
1→15→5→6→8→1
Configuration 115:
1→15→5→8→1
Configuration 116:
1→15→5→1
Configuration 117:
1→15→6→8→1
Configuration 118:
1→15→6→1
Configuration 119:
1→15→1

Figure 13:
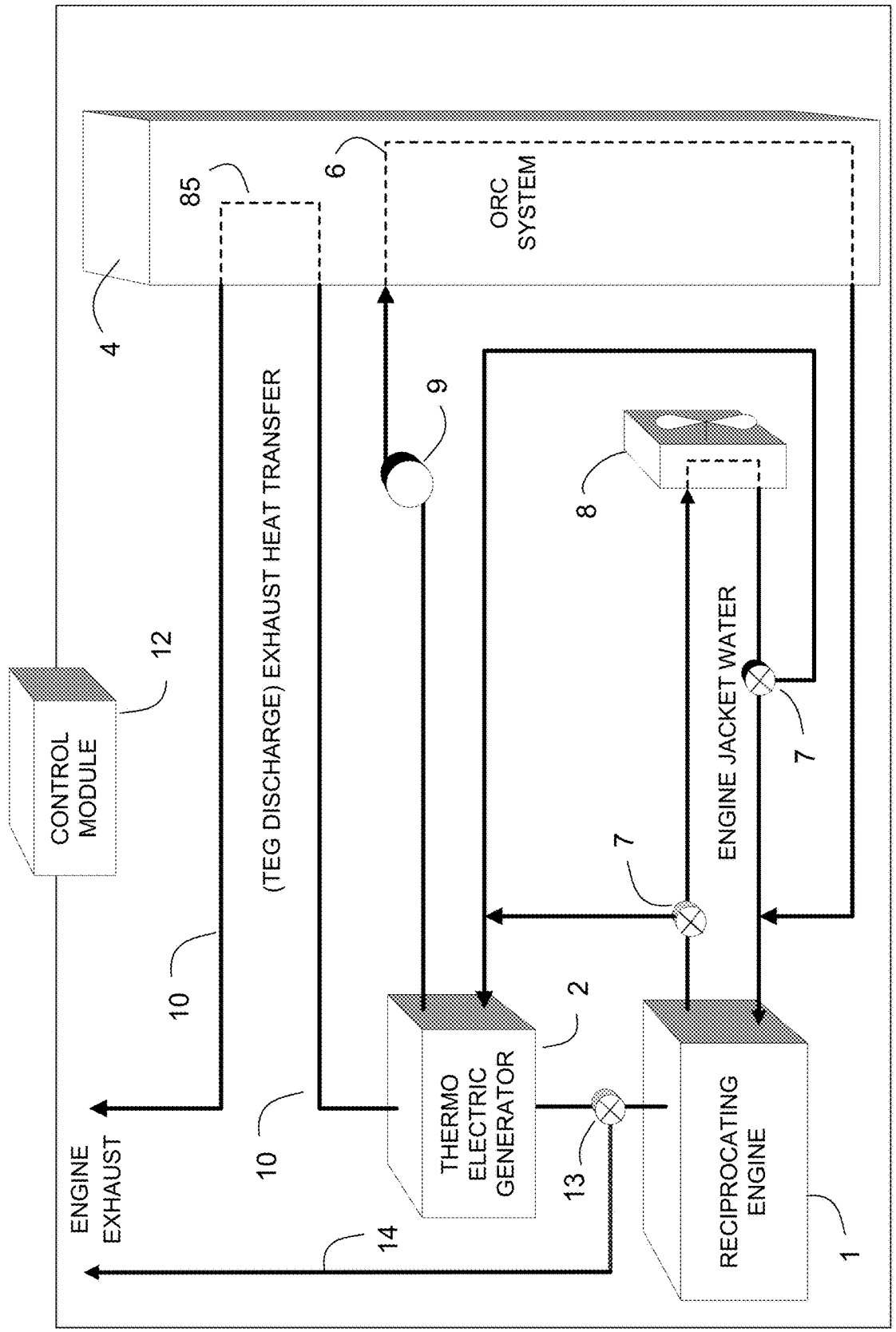
FIG. 13 shows yet another power generation system comprising a reciprocating engine, radiator, TEG, and an ORC system capable of cross exchanging engine exhaust gas directly with the ORC propellant, with circulating pumps control valves, wherein certain system controls may be provided by a control module under an illustrative embodiment.

Turning to FIG. 13, the illustrative embodiment is unique in comparison to the previously described configurations because the engines exhaust in exhaust pipe 10 is diverted directly into the heat exchanger 85 that is part of the ORC system 4. In Configuration 2 (1→2→6→1+10→85→10) described below, the engine radiator 8 is configured to operate in parallel to the waste heat equipment and the engines radiator fluid is sent to the TEG 2, then to the ORC systems 4 heat exchanger Low-ORC 6 before being returned to the reciprocating engine 1 to repeat the process. In the other thermal loop of this configuration, exhaust flow discharged from the TEG 2 is piped directly into the ORC systems 4 heat exchanger 85 such that no heat transfer fluid is required. This direct contact exchange (engine exhaust to propellant) may be applicable to any of the other combinations shown that use the thermal fluid heater for energy transfer to the ORC system 4. Specifically, in FIGS. 3, 6, and 9 rather than heating a thermal fluid with the engine exhaust discharging from the TEG 2, the engine exhaust can be cross exchanged with the propellant in the ORC system 4 without an intermediary thermal fluid to transfer the heat energy.

Various illustrative configurations for FIG. 13
Configuration 1:
1→8→1+10→85→10
Configuration 2:
1→2→6→1+10→85→10

Configuration 3:
1→8→2→6→1+10→85→10
Configuration 4:
1→2/8→6→1+10→85→10 (split flow between 2 and 8)

Another embodiment (which may be thought of as "Configuration 14", but not explicitly shown in the figures) may be realized where the configuration is similar to the previous figures but narrows to a specific application of a reciprocating engine driving a natural gas compressor (known in the industry as a "compressor package"). In this arrangement, the compressor package may comprise an aerial cooler which includes cooling sections for the engines radiator along with cooling sections for each stage of gas compression and at times cooling sections for an auxiliary jacket water cooler or lube oil cooler section. These aerial coolers are typically equipped with a large diameter cooling fan powered by the reciprocating engine 1. As described in U.S. Pat. No. 8,528,333, titled "Controlled Organic Rankine Cycle System for Recovery and Conversion of Thermal Energy", U.S. patent application Ser. No. 12/554,853, titled "Supplementary Thermal Energy Transfer in Thermal Energy Recovery Systems" and U.S. patent application Ser. No. 13/961,341, titled "Controlled Organic Rankine Cycle System for Recovery and Conversion of Thermal Energy", each of which is incorporated by reference in their entireties herein, the concept of off-loading the fan load from the reciprocating engine to be driven by an alternate power source (electrical with VI-D) still applies.

Further, each stage of gas requires cooling whether the jacket water in the radiator section requires cooling or not (because the jacket water may be getting cooled by an ORC system connected to the gas compressor). Therefore, because this fan will be operating whether there is engine jacket water in the radiator that requires cooling or not, the opportunity exists to make use of this cooling capacity to the thermal fluid used in the cooling of the TEG at no parasitic energy consumption (fan already being power for gas cooling) and at no additional capital cost (radiator section of the aerial cooler already exists to cool the engine during normal operation when no ORC system connected or in parallel to an ORC system). Meaning, the heat of compression, in addition to the reciprocating engine, could be another heat source in the above described systems. This arrangement will increase the temperature delta across the TEG with no parasitic cost to the additional cooling capacity.

In the foregoing detailed description, it can be seen that various features are grouped together in individual embodiments for the purpose of brevity in the disclosure. This method of disclosure is not to be interpreted as reflecting an intention that the subsequently claimed embodiments require more features than are expressly recited in each claim.

Further, the descriptions of the disclosure are provided to enable any person skilled in the art to make or use the disclosed embodiments. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but rather are to be accorded the widest scope consistent with the principles and novel features disclosed herein.

What is claimed is:

1. A heat recovery system, comprising:
a reciprocating engine;
a jacket water fluid radiator coupled to the reciprocating engine;
a thermo-electric generator (TEG) configured to be selectively coupled to the reciprocating engine, the jacket water fluid radiator, and/or to an Organic Rankine Cycle (ORC); and
a control module, wherein the control module is configured to selectively divert reciprocating engine jacket water fluid through any of the jacket water fluid radiator and/or the ORC to decrease the energy in the jacket water fluid, and divert reciprocating engine jacket water fluid through the TEG to increase the energy in the jacket water fluid,
wherein the control module is configured to selectively divert reciprocating engine jacket water fluid through any of the jacket water fluid radiator, ORC and/or TEG to increase the energy efficiency of the heat recovery system.

2. The heat recovery system of claim 1, wherein the control module is configured to divert reciprocating engine jacket water fluid such that thermal fluid is passed through the jacket water fluid radiator before being passed to the TEG to increase the efficiency of the heat recovery system.

3. The heat recovery system of claim 1, wherein the control module is configured to divert reciprocating engine jacket water fluid discharge such that thermal fluid is first passed through the ORC, followed by the jacket water fluid radiator, before being passed to the TEG to further reduce a temperature of the jacket water before interfacing with the TEG.

4. The heat recovery system of claim 1, wherein the control module is configured to divert reciprocating engine jacket water fluid to cause the jacket water fluid to return to the reciprocating engine at a targeted amount of energy extracted from the jacket water, based on a jacket water return temperature.

5. The heat recovery system of claim 4, wherein the control module is configured to divert reciprocating engine jacket water fluid through the heat recovery system such that a thermostatic valve of the reciprocating engine remains open such that reciprocating engines discharge jacket water flow is not restricted or modulated by the thermostatic valve.

6. The heat recovery system of claim 4, wherein the control module is configured to divert reciprocating engine jacket water fluid through the heat recovery system to prevent overheating or overcooling of the reciprocating engine.

7. A heat recovery system, comprising:
a reciprocating engine comprising a thermostatic valve;
a jacket water fluid radiator coupled to the reciprocating engine via a piping configuration comprising one or more valves;
an Organic Rankine Cycle (ORC), configured to be selectively coupled to the reciprocating engine, the jacket water fluid radiator, and to a thermo-electric generator (TEG) via the piping configuration; and
a control module, wherein the control module is configured to selectively control the one or more valves of the piping configuration to divert reciprocating engine jacket water fluid through any of the jacket water fluid radiator and/or the ORC to decrease the energy in jacket water fluid, and divert reciprocating engine jacket water fluid through the TEG to increase the energy in the jacket water fluid,
wherein the control module is configured to selectively divert reciprocating engine jacket water fluid through any of the radiator, ORC and TEG to control the return inlet temperature of the reciprocating engines jacket water to the reciprocating engine such that the thermostatic valve of the reciprocating engine does not modulate.

8. The heat recovery system of claim 7, wherein the control module is configured to divert reciprocating engine jacket water fluid to cause the thermostatic valve to remain open and provide a substantially constant flow of engine jacket water to the heat recovery system.

9. The heat recovery system of claim 7, wherein the control module is configured to divert reciprocating engine jacket water fluid such that jacket water fluid is passed through the radiator before being passed to the TEG to increase a temperature differential between an exhaust side of the TEG and a jacket water fluid cooled side of the TEG.

10. The heat recovery system of claim 7, wherein the control module is configured to divert reciprocating engine jacket water fluid discharge such that jacket water fluid is first passed through the ORC, followed by the radiator, before being passed to the TEG to reduce the temperature of the jacket water fluid before interfacing with the TEG.

11. The heat recovery system of claim 7, wherein the control module is configured to divert reciprocating engine jacket water fluid to cause jacket water fluid to return to the reciprocating engine with a lesser amount of energy in the jacket water fluid with which it left the reciprocating engine with.

12. The heat recovery system of claim 11, wherein the control module is configured to divert reciprocating engine jacket water fluid through the heat recovery system such that the thermostatic valve of the reciprocating engine remains open such that reciprocating engines discharge jacket water flow is not restricted or redirected by the thermostatic valve.

13. The heat recovery system of claim 11, wherein the control module is configured to divert reciprocating engine jacket water fluid through the heat recovery system to prevent overheating or overcooling of the jacket water before returning to the reciprocating engine.

14. A method for operating a heat recovery system, comprising:
coupling a reciprocating engine, a reciprocating engine jacket water fluid radiator, an Organic Rankine Cycle (ORC), and a thermo-electric generator (TEG) of the heat recovery system via a piping configuration comprising one or more valves;
sensing, via sensors, environmental conditions in the heat recovery system; and
selectively diverting, via a control module communicatively coupled to the sensors, reciprocating engine jacket water fluid of the piping configuration through any of the radiator and/or the ORC to decrease the energy in the reciprocating engine jacket water fluid, and divert reciprocating engine jacket water fluid through the TEG to increase the energy in the reciprocating engine jacket water fluid based on the sensed environmental conditions,
wherein the selective diverting of the reciprocating engine jacket water fluid comprises diverting the reciprocating engine jacket water fluid through any of the radiator, ORC and/or TEG to increase the energy efficiency of the heat recovery system through heat recovery.

15. The method of claim 14, further comprising diverting, via the control module, reciprocating engine jacket water fluid such that jacket water fluid is passed through the radiator before being passed to the TEG to increase reuse of thermal energy and to a temperature differential in the system.

16. The heat recovery system of claim 14, further comprising diverting, via the control module, reciprocating engine jacket water fluid discharge such that jacket water fluid is first passed through the ORC, followed by the radiator, before being passed to the TEG to reduce the temperature of the jacket water before interfacing with the TEG.

17. The heat recovery system of claim 14, further comprising diverting, via the control module, reciprocating engine jacket water fluid to cause jacket water fluid to return to the reciprocating engine at a targeted return temperature.

18. The heat recovery system of claim 14, further comprising diverting, via the control module, reciprocating engine jacket water fluid through the heat recovery system such that the thermostatic valve of the reciprocating engine remains open such that reciprocating engines discharge jacket water flow is not restricted by the thermostatic valve.

19. The heat recovery system of claim 14, further comprising diverting, via the control module, reciprocating engine jacket water fluid through the heat recovery system to prevent overheating in the reciprocating engine.

* * * * *